(12) United States Patent
Lee et al.

(10) Patent No.: US 12,002,863 B2
(45) Date of Patent: Jun. 4, 2024

(54) SEMICONDUCTOR DEVICE WITH AIR-GAP SPACERS

(71) Applicant: Taiwan Semiconductor Manufacturing Company, Ltd., Hsin-Chu (TW)

(72) Inventors: Kai-Hsuan Lee, Hsinchu (TW); Chen-Ming Lee, Taoyuan County (TW); Fu-Kai Yang, Hsinchu (TW); Mei-Yun Wang, Hsin-Chu (TW); Yen-Ming Chen, Hsin-Chu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 220 days.

(21) Appl. No.: 17/462,484

(22) Filed: Aug. 31, 2021

(65) Prior Publication Data

US 2023/0068664 A1    Mar. 2, 2023

(51) Int. Cl.
*H01L 29/417* (2006.01)
*H01L 29/06* (2006.01)
(Continued)

(52) U.S. Cl.
CPC .... *H01L 29/41775* (2013.01); *H01L 29/0665* (2013.01); *H01L 29/42392* (2013.01);
(Continued)

(58) Field of Classification Search
CPC ........... H01L 29/41775; H01L 29/0665; H01L 29/42392; H01L 29/515; H01L 29/6653; H01L 29/66545; H01L 29/7851; H01L 29/78696; H01L 29/0673; H01L 29/4991; H01L 29/165; H01L 29/267; H01L 29/66439; H01L 29/7848; H01L 29/6656; H01L 29/775; H01L 21/823431; H01L 21/823821; H01L 21/845; H01L 27/0886; H01L 27/0924; H01L 27/10826; H01L 27/10879; H01L 27/1211; H01L 29/41791; H01L 29/66795–66818; H01L 29/785–7856; H01L 2029/7857–7858; H01L 2924/13067; H01L 29/04–045; H01L 29/16–1608; H01L 29/18–185;
(Continued)

(56) References Cited

U.S. PATENT DOCUMENTS 8,796,666 B1    8/2014  Huang et al.
8,815,712 B2    8/2014  Wan et al.
(Continued)

*Primary Examiner* — Mohammad A Rahman
(74) *Attorney, Agent, or Firm* — Haynes and Boone, LLP

(57) ABSTRACT

A method includes forming a gate structure on a substrate, forming a seal spacer covering a sidewall of the gate structure, forming a sacrificial spacer covering a sidewall of the seal spacer, forming source/drain regions sandwiching a channel region that is under the gate structure, and depositing a contact etch stop layer covering a sidewall of the sacrificial spacer. The method further includes removing the sacrificial spacer to form a trench, wherein the trench exposes a sidewall of the contact etch stop layer and the sidewall of the seal spacer, and depositing an inter-layer dielectric layer, wherein the inter-layer dielectric layer caps the trench, thereby defining an air gap inside the trench.

20 Claims, 33 Drawing Sheets

(51) Int. Cl.
    *H01L 29/423*     (2006.01)
    *H01L 29/51*     (2006.01)
    *H01L 29/66*     (2006.01)
    *H01L 29/78*     (2006.01)
    *H01L 29/786*     (2006.01)

(52) U.S. Cl.
    CPC ........ *H01L 29/515* (2013.01); *H01L 29/6653* (2013.01); *H01L 29/66545* (2013.01); *H01L 29/66795* (2013.01); *H01L 29/7851* (2013.01); *H01L 29/78696* (2013.01)

(58) Field of Classification Search
    CPC .. H01L 29/22–2206; H01L 29/36–365; B82Y 10/00
    See application file for complete search history.

(56) References Cited

U.S. PATENT DOCUMENTS

| | | |
|---|---|---|
| 8,963,258 B2 | 2/2015 | Yu et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 10,522,642 B2 | 12/2019 | Lee |
| 2013/0285116 A1 | 10/2013 | Lochtefeld et al. |
| 2020/0135590 A1* | 4/2020 | Lai ...................... H01L 29/6656 |

* cited by examiner

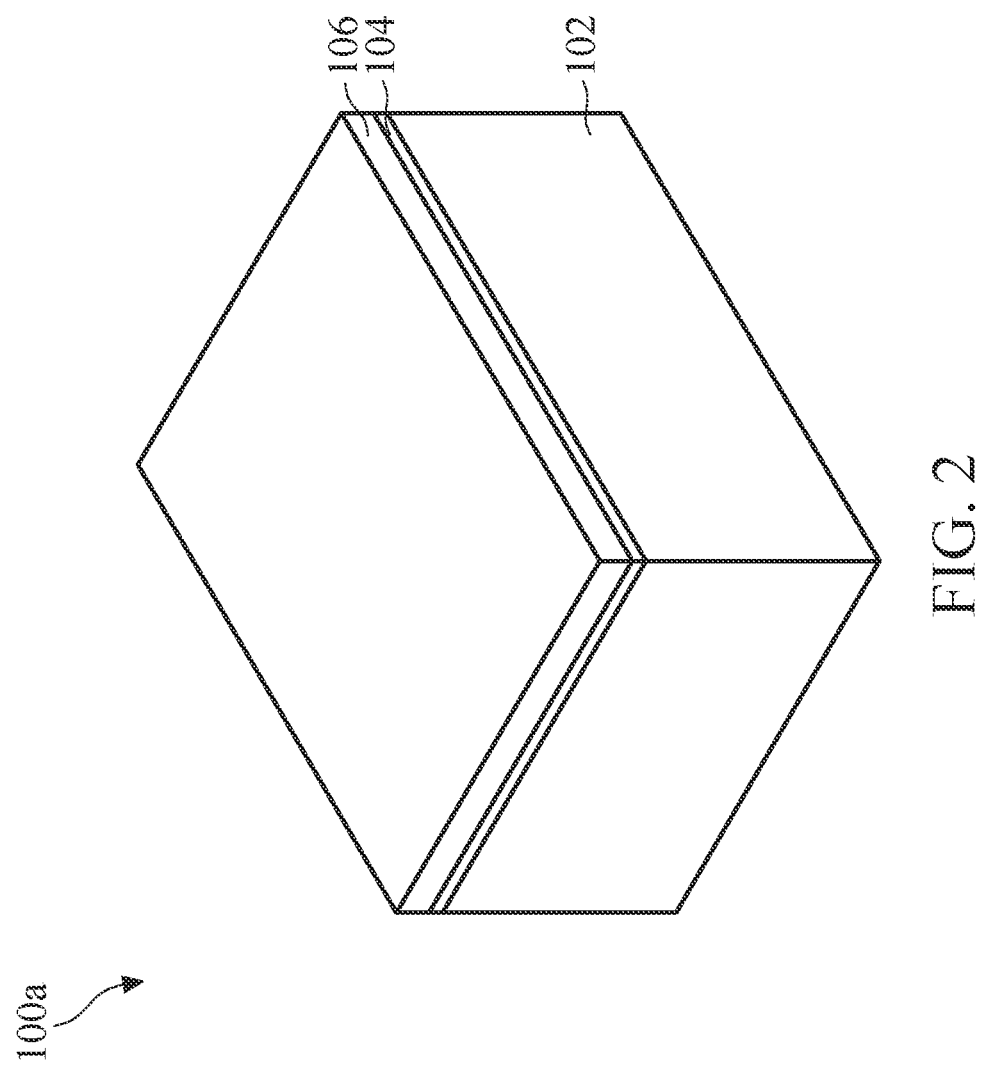

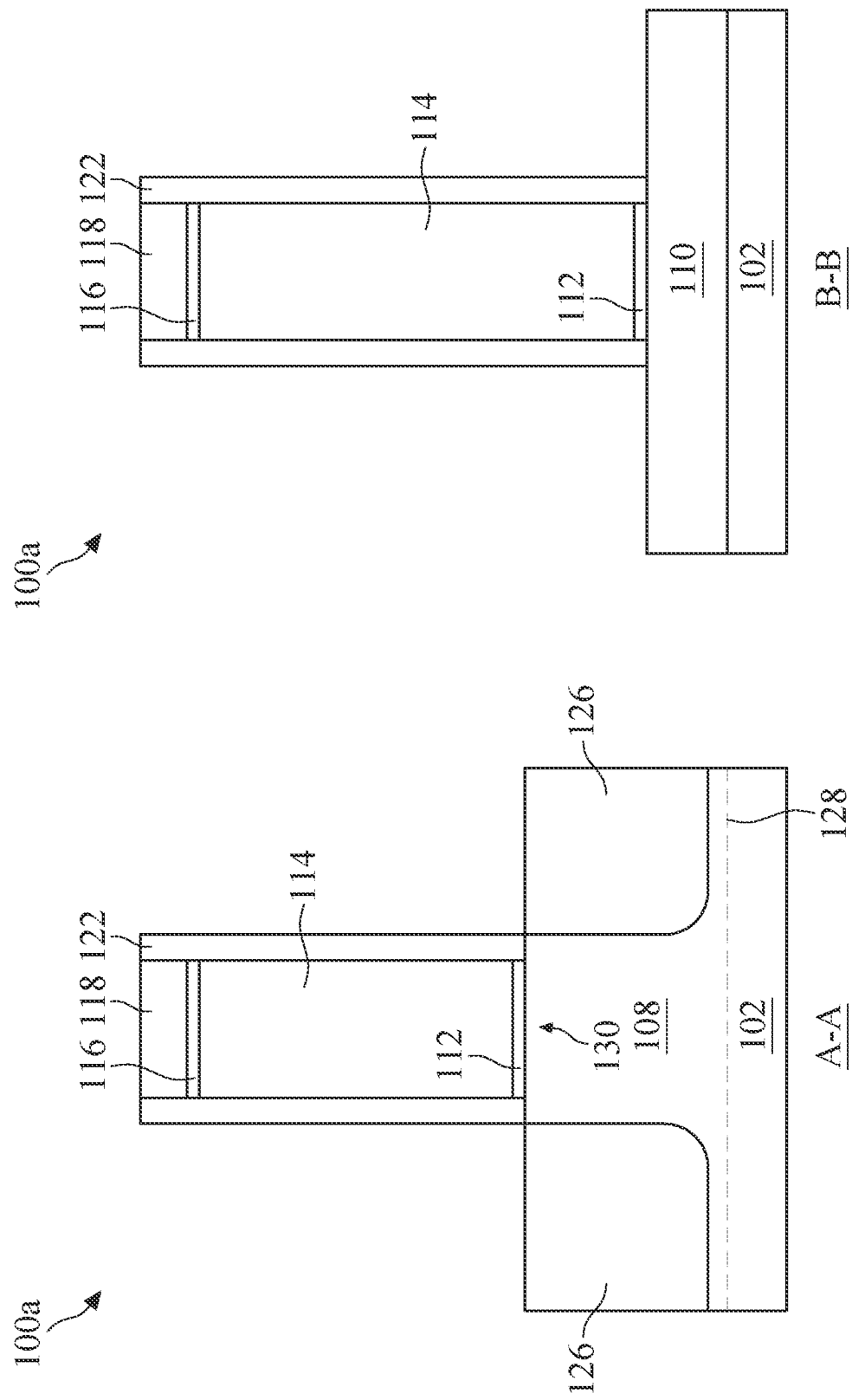

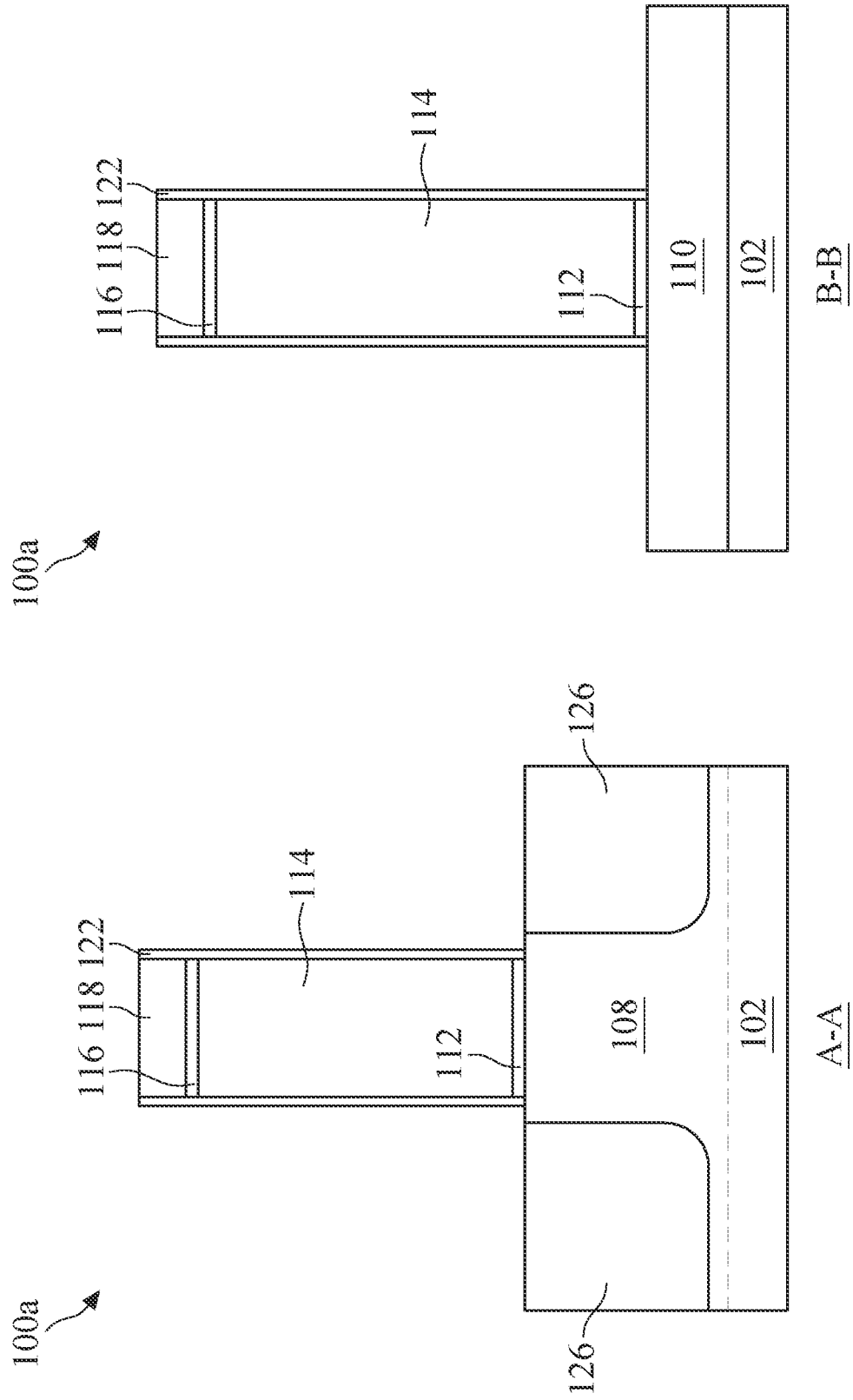

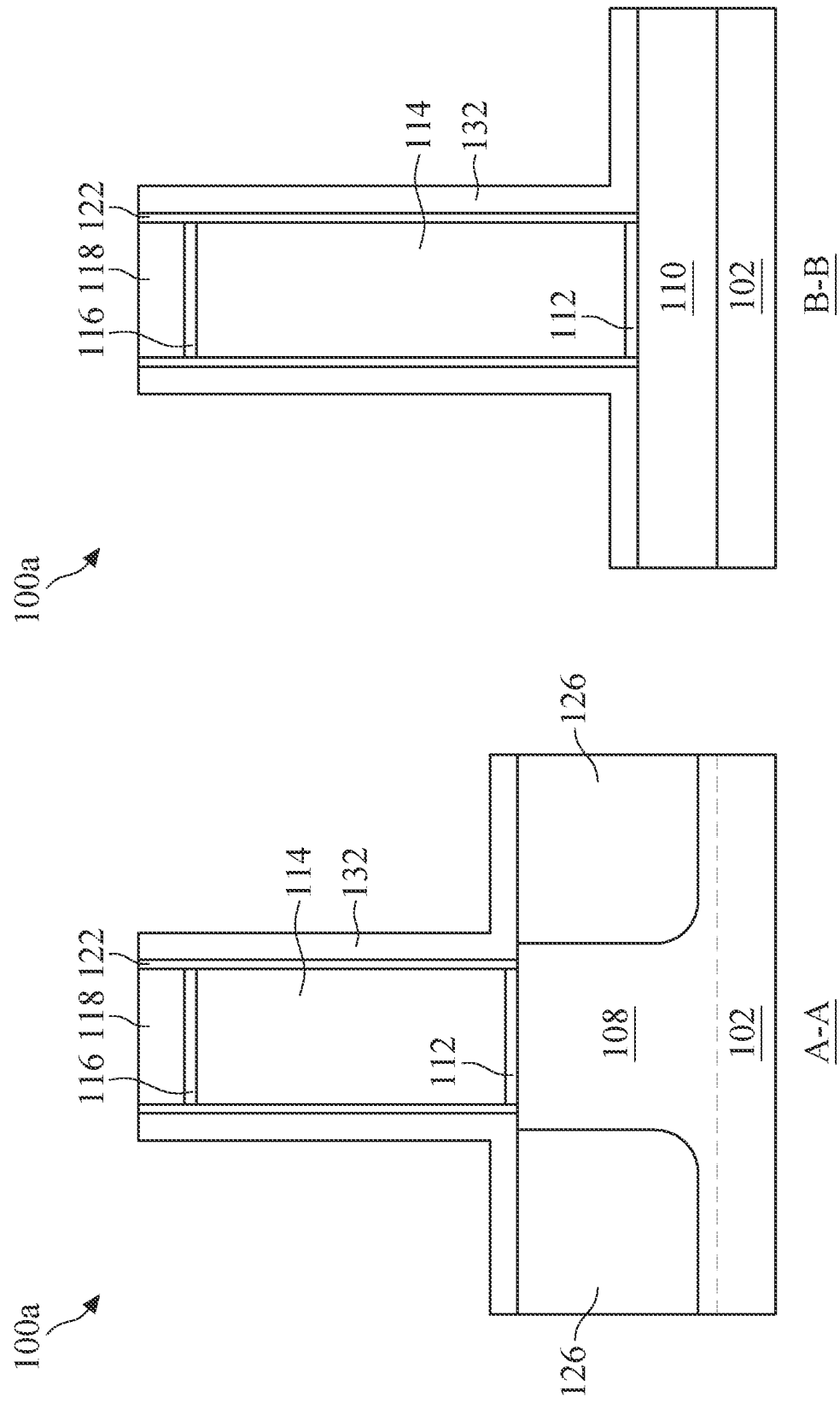

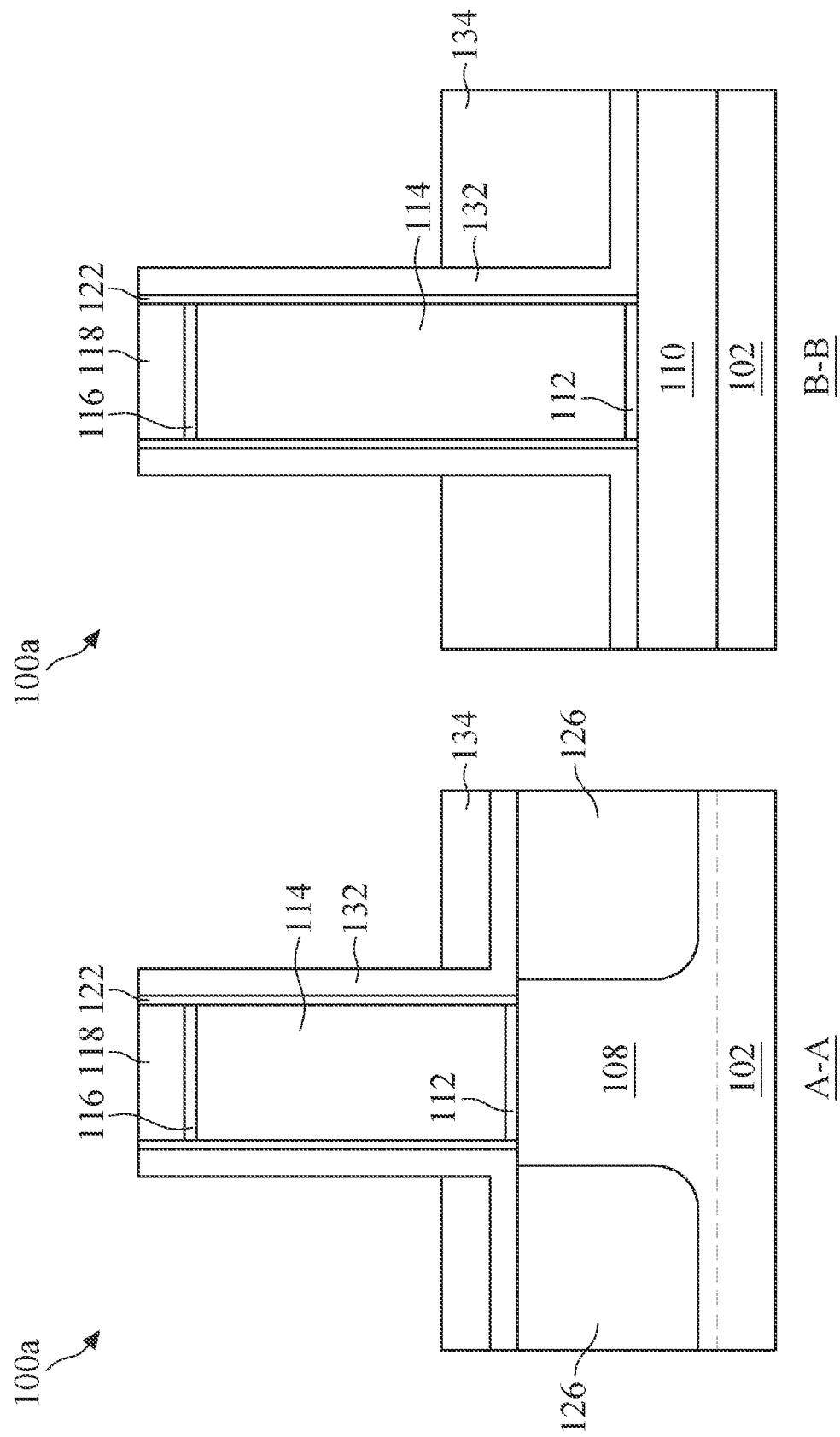

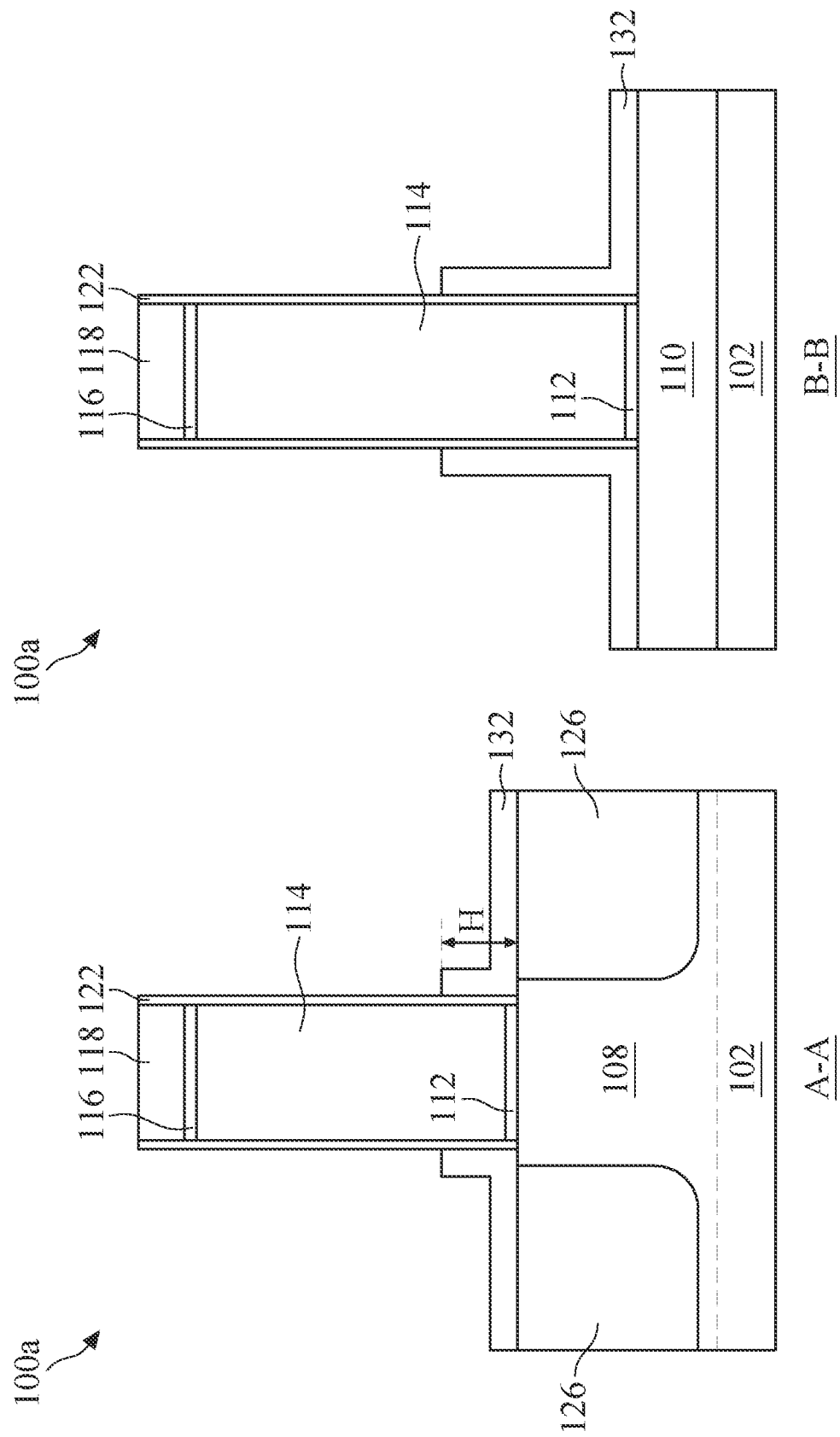

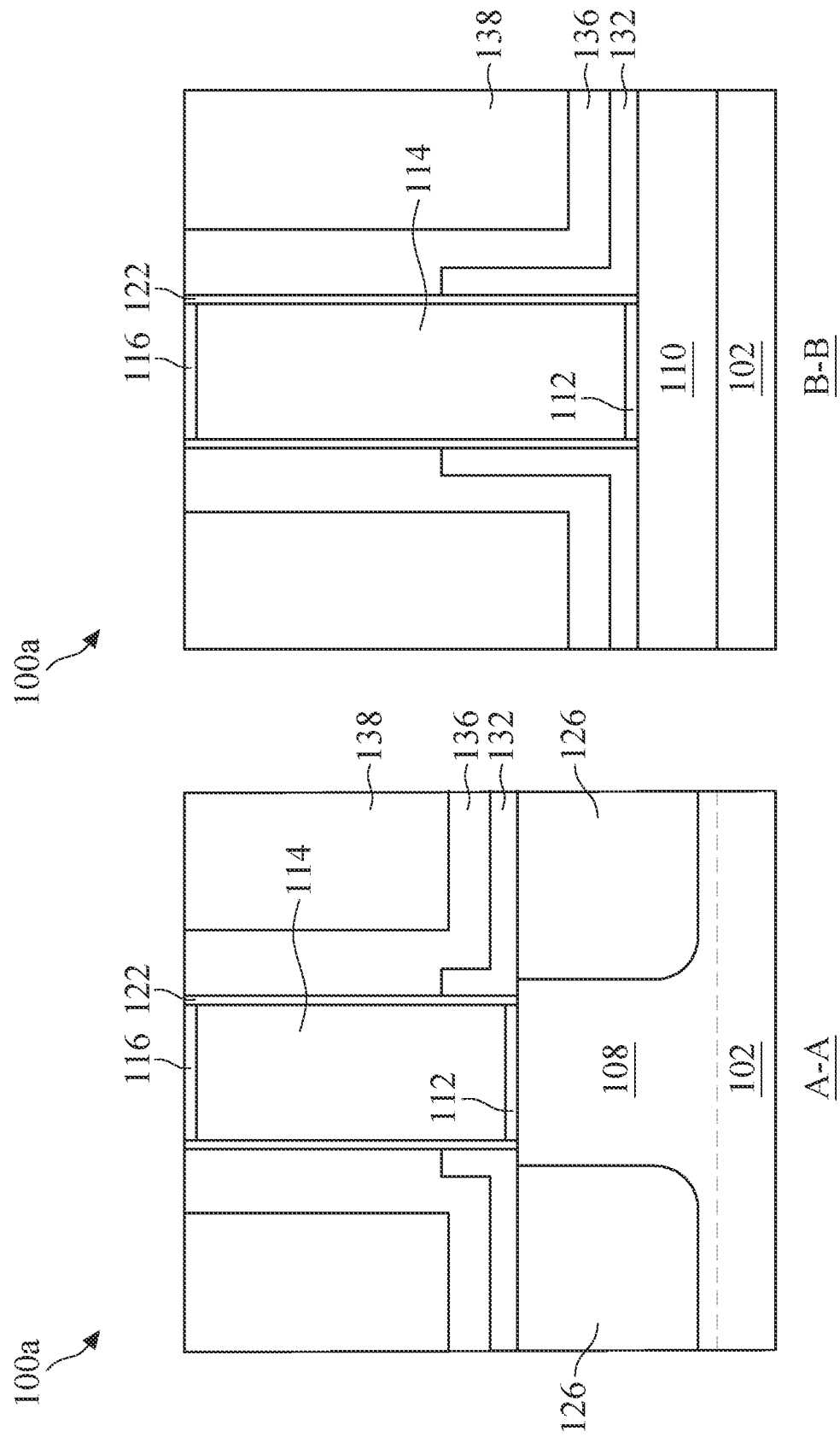

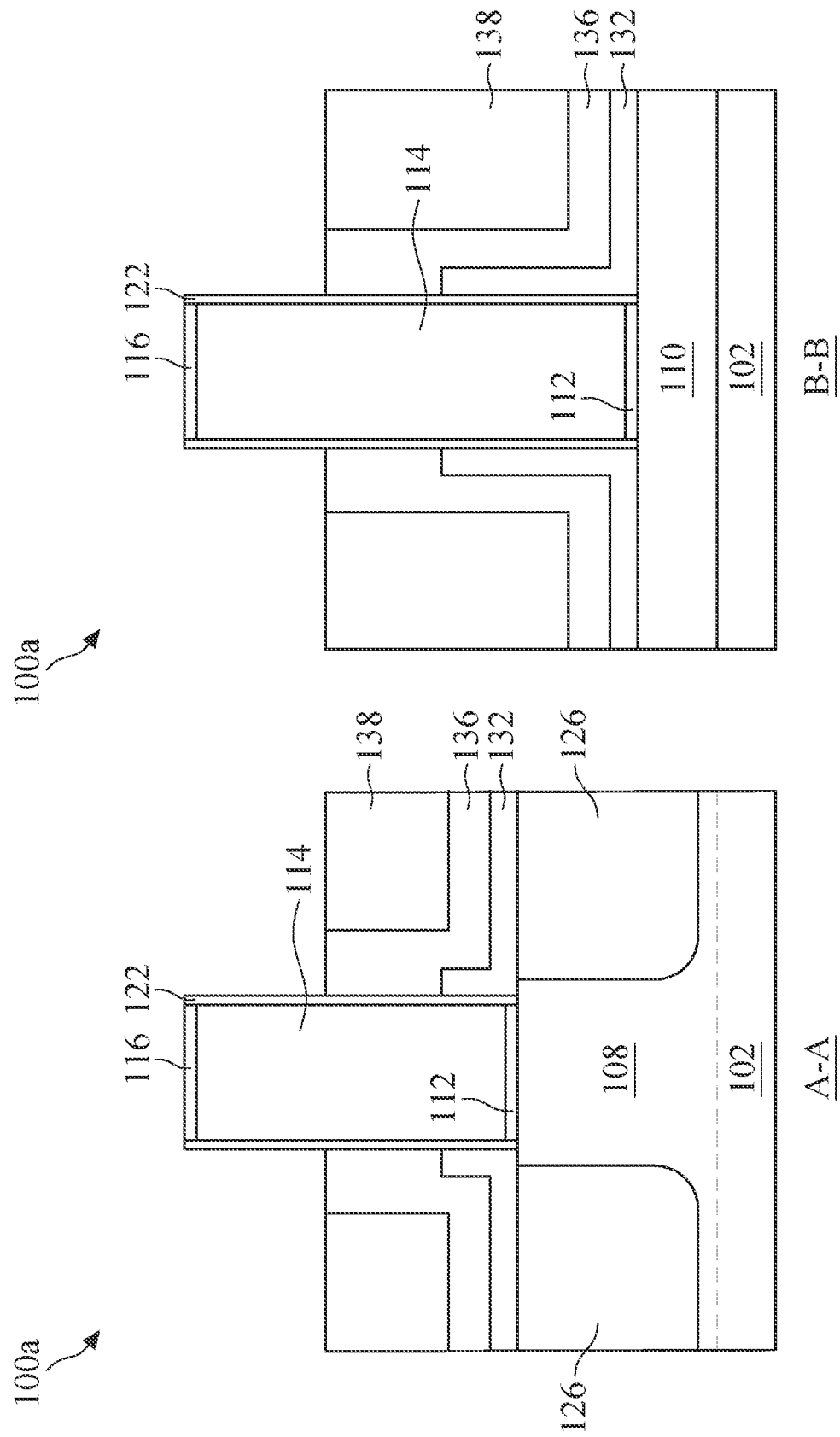

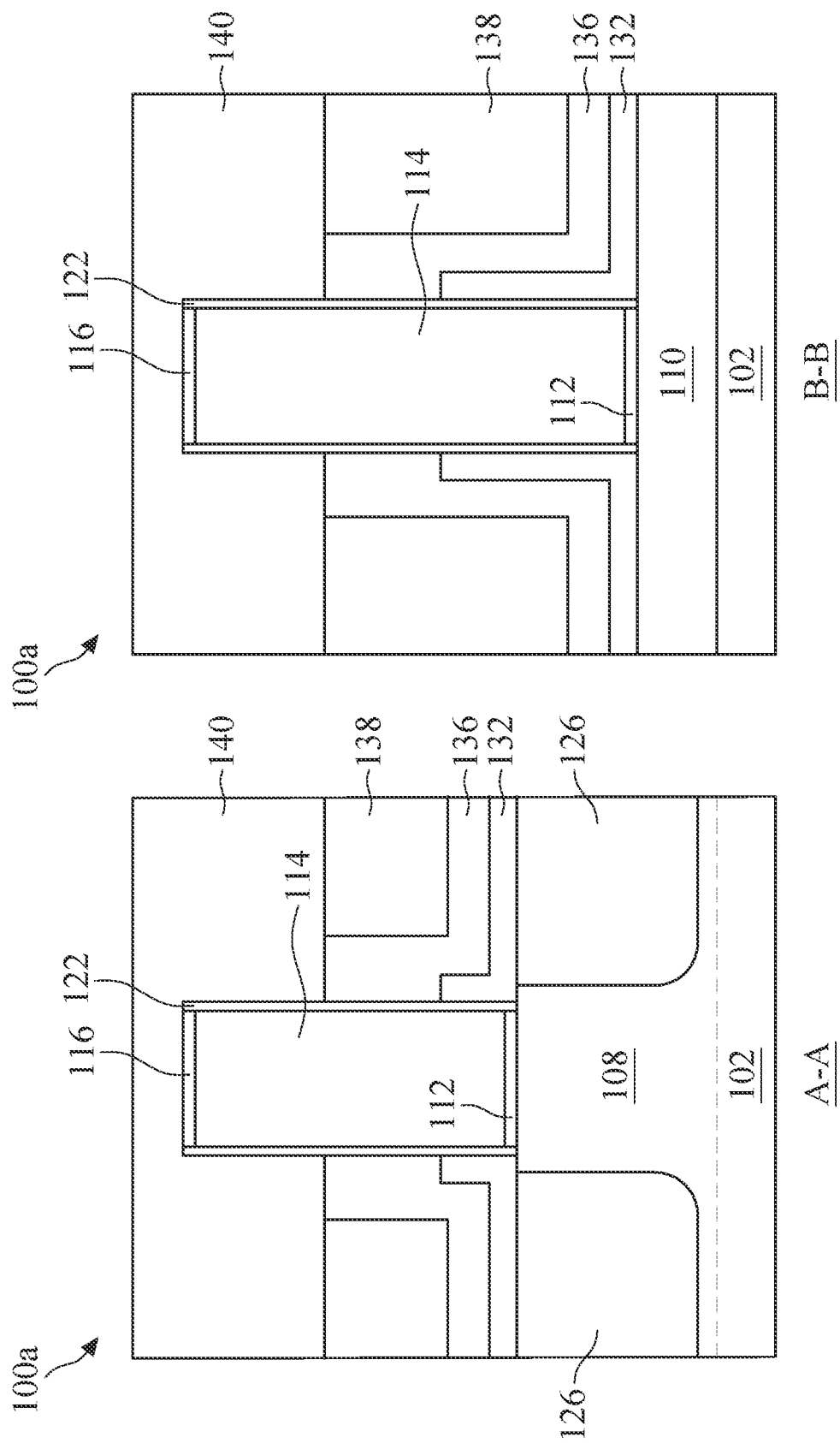

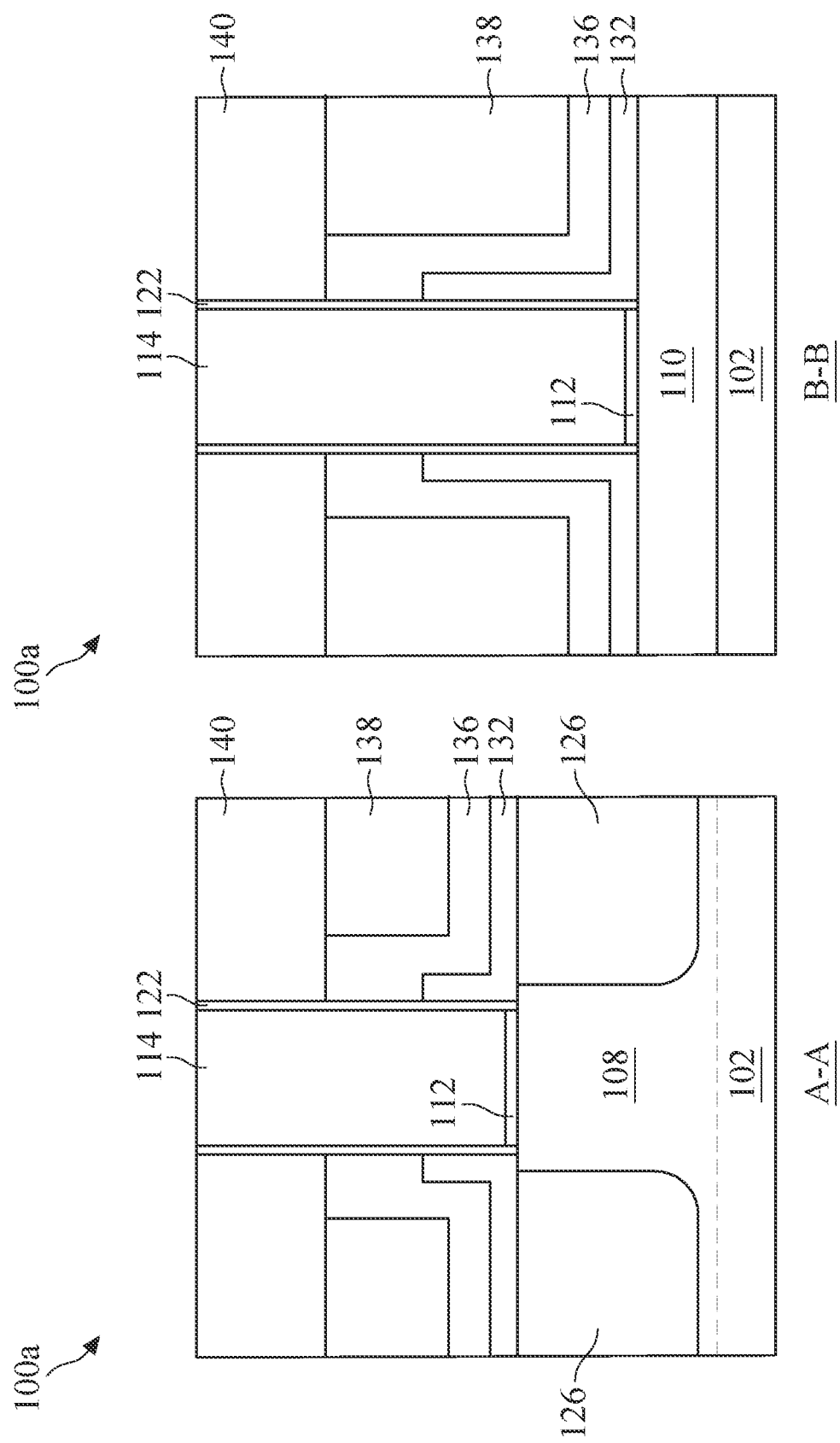

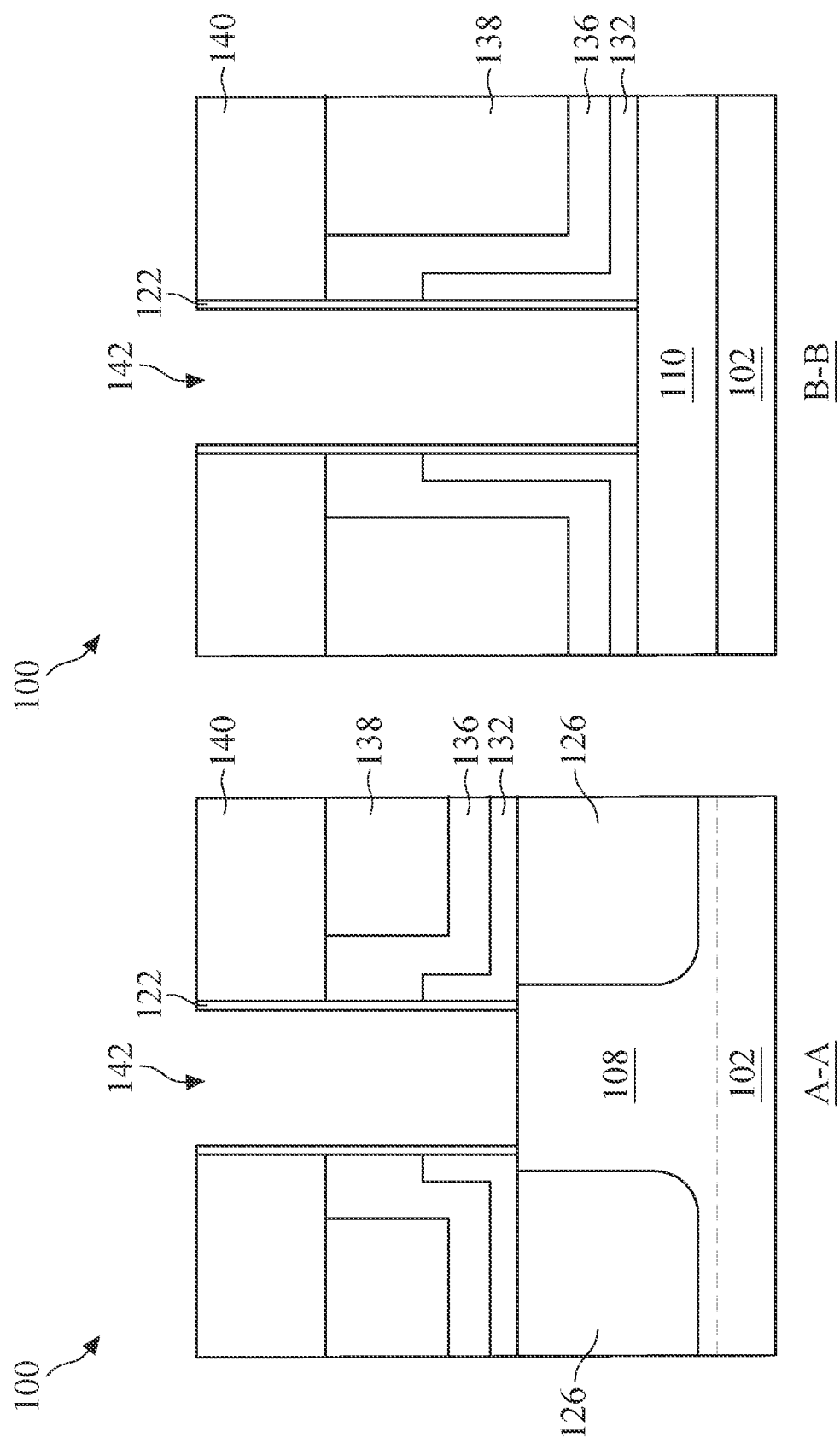

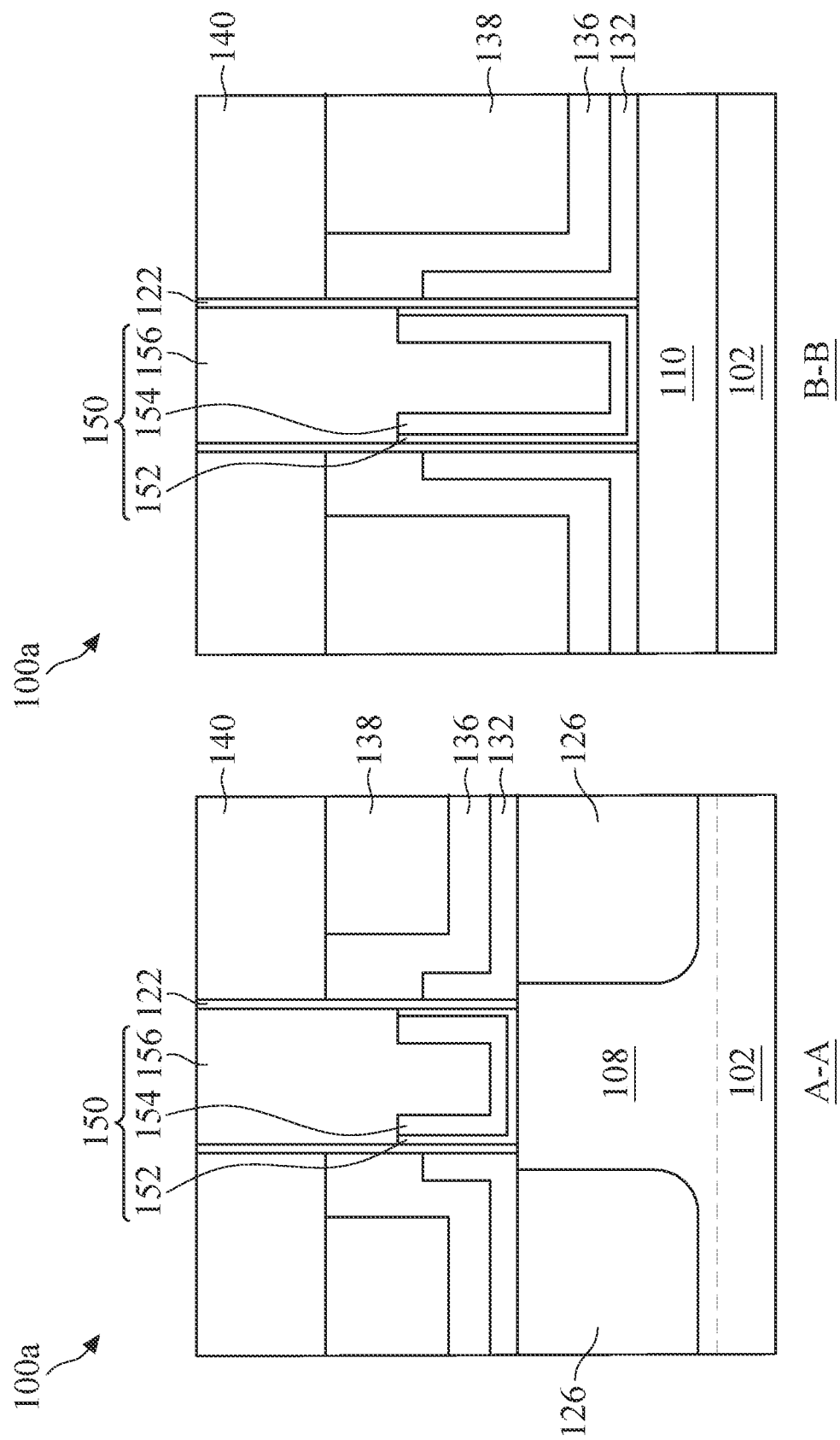

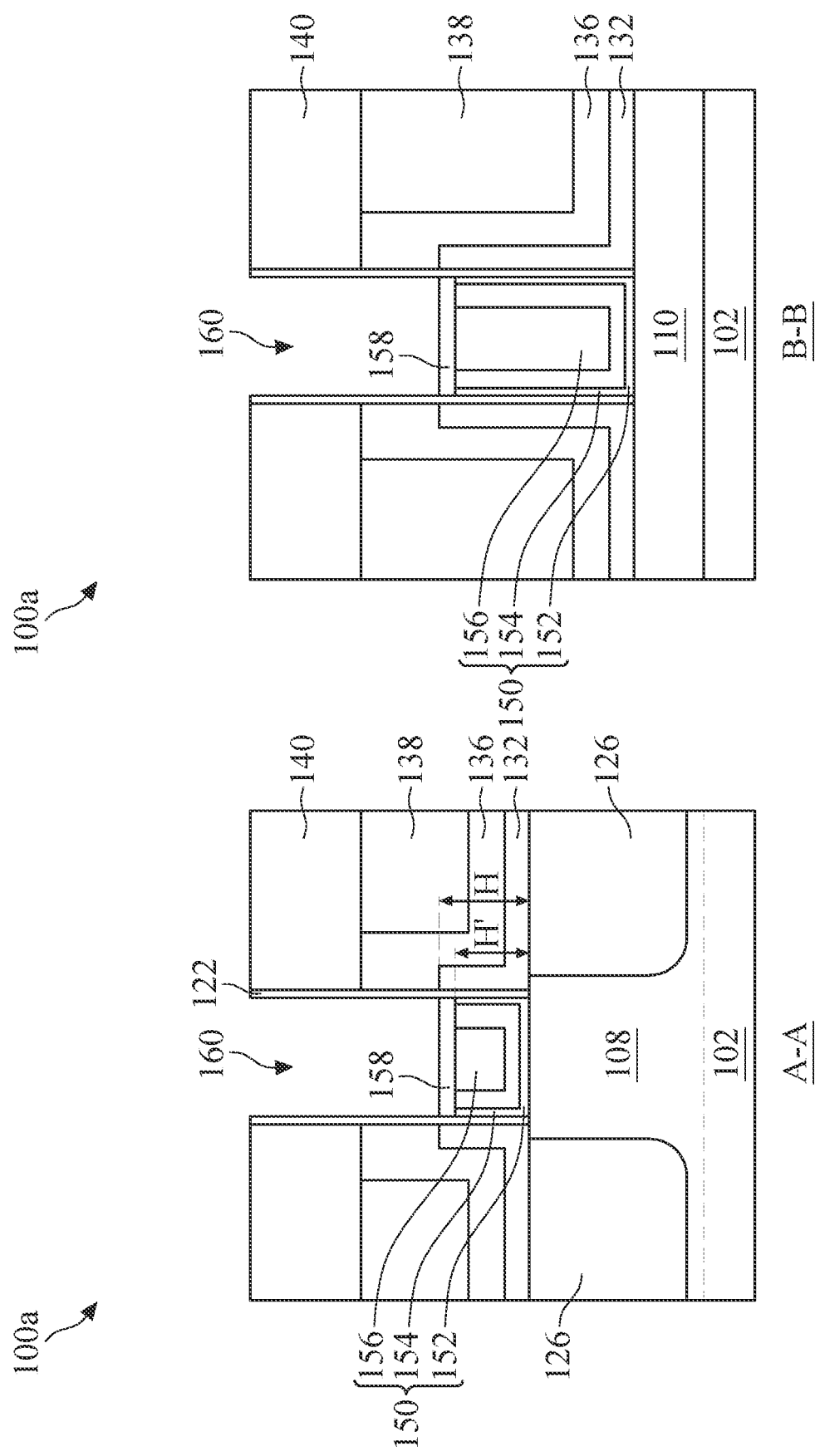

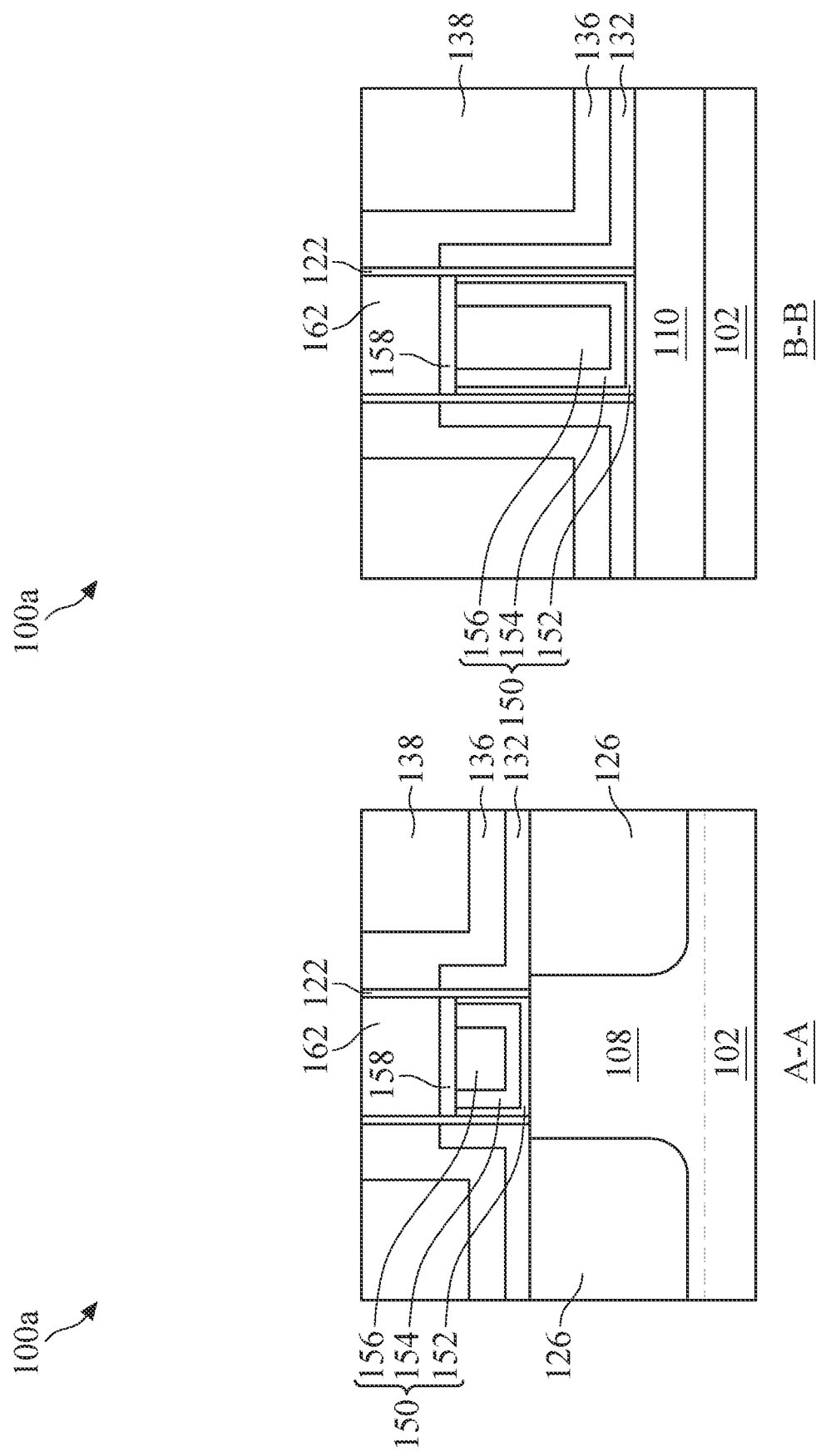

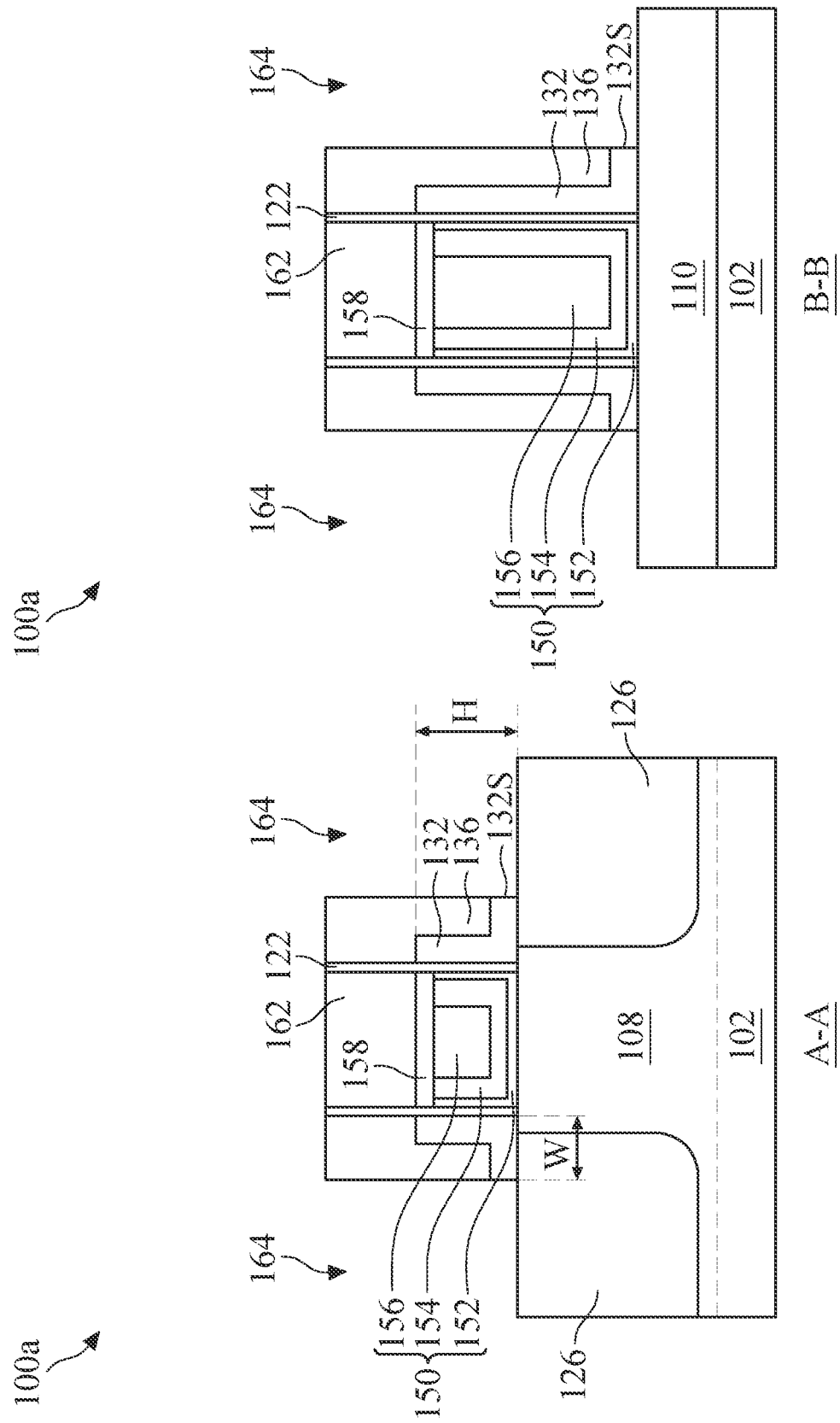

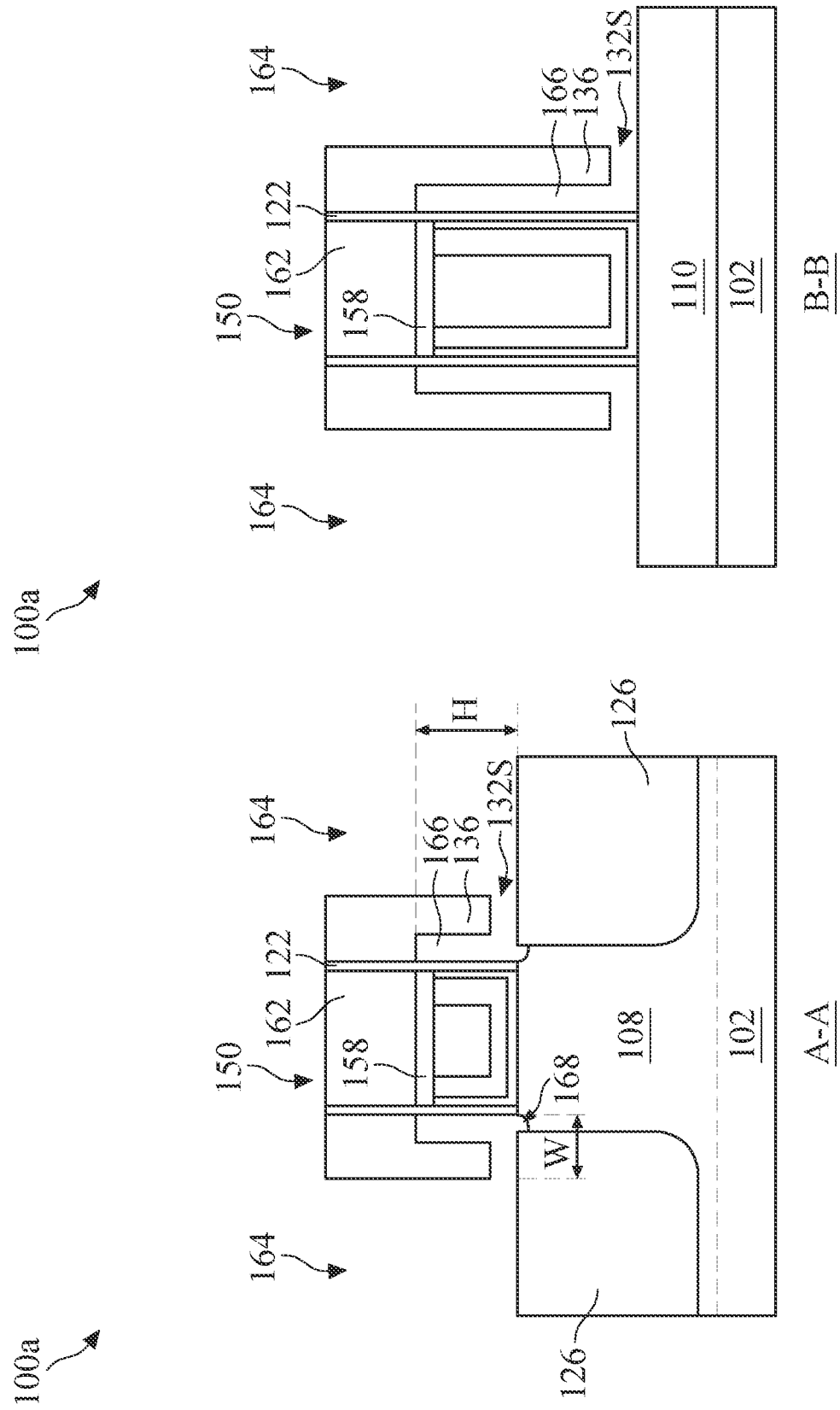

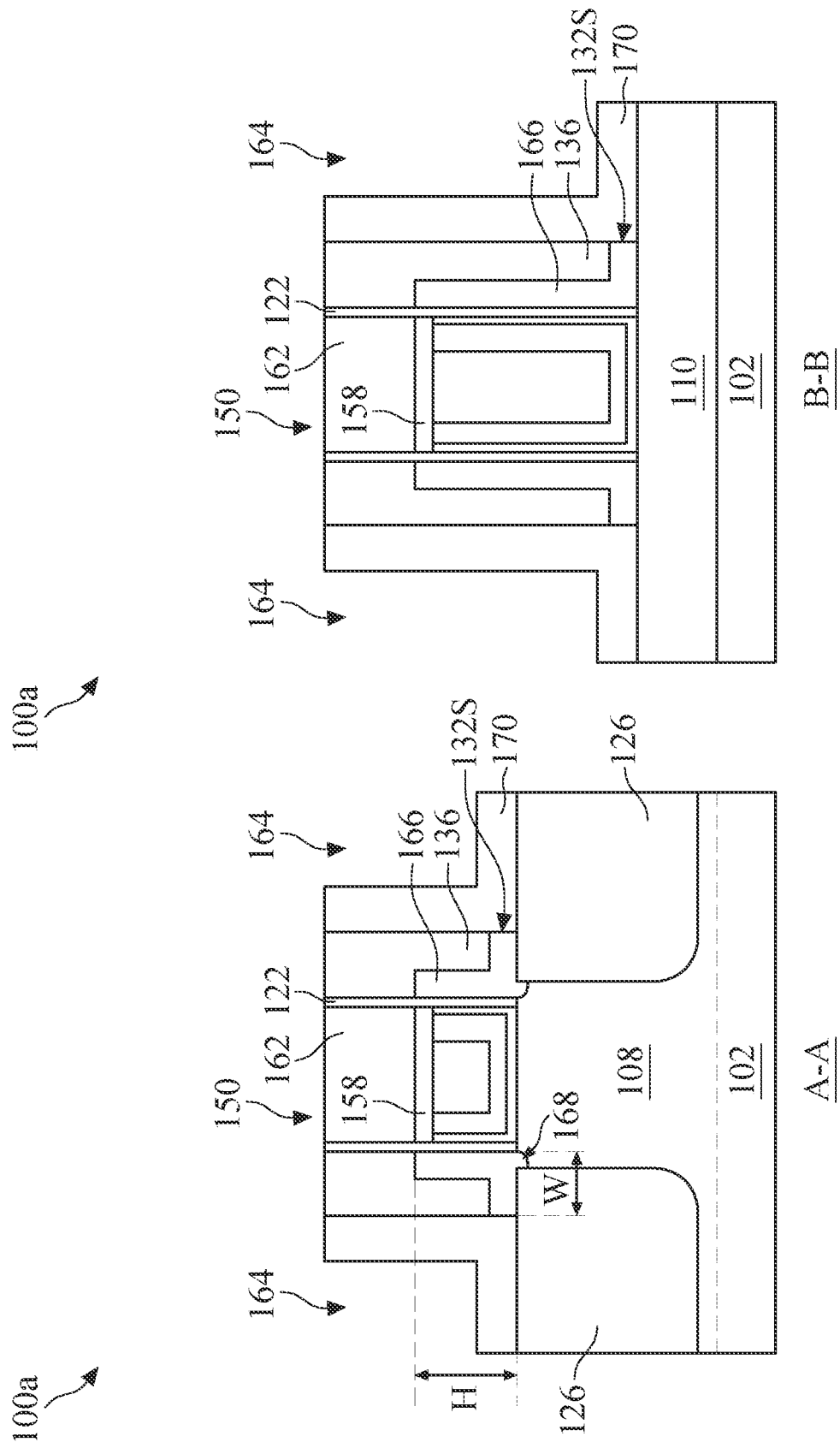

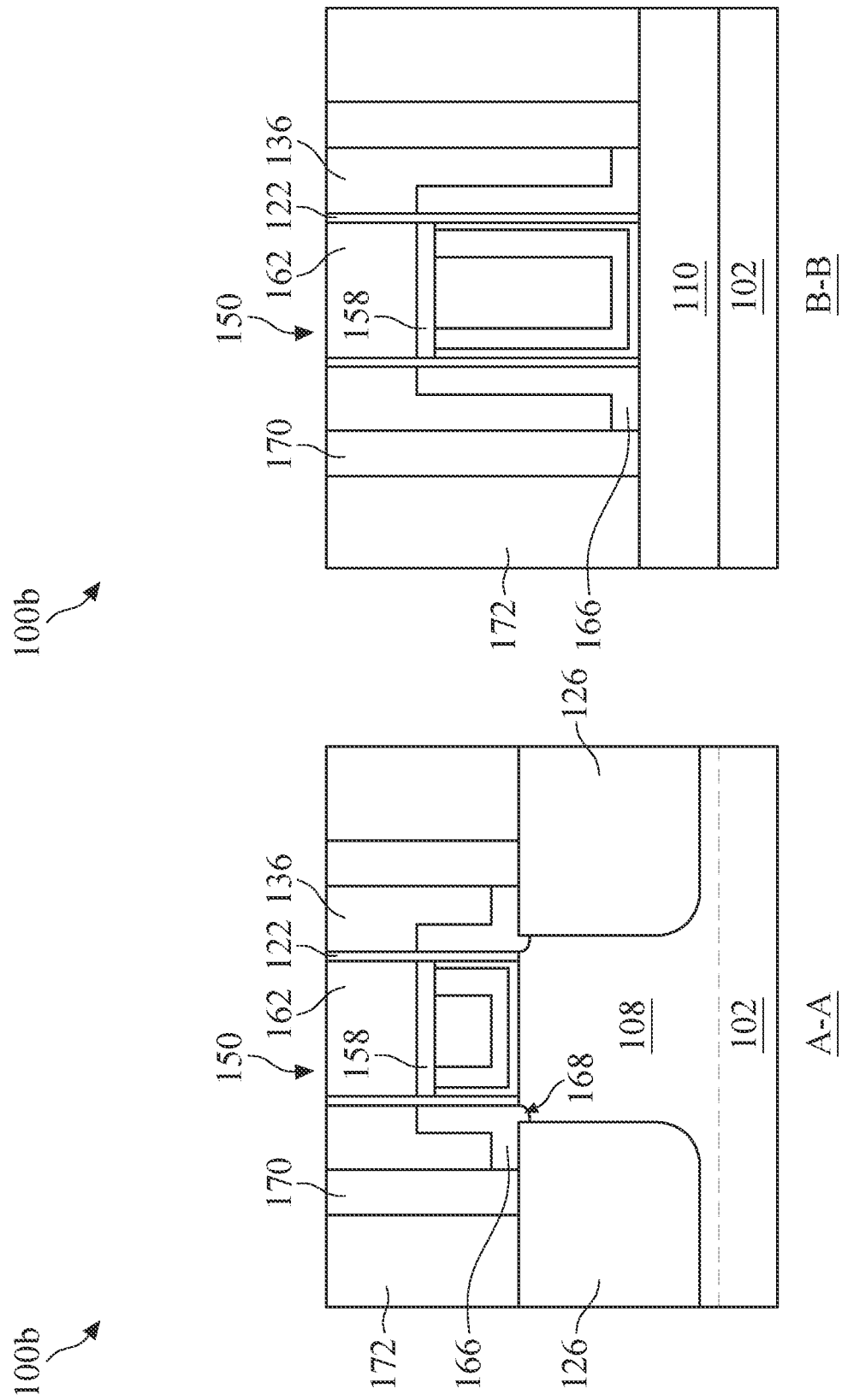

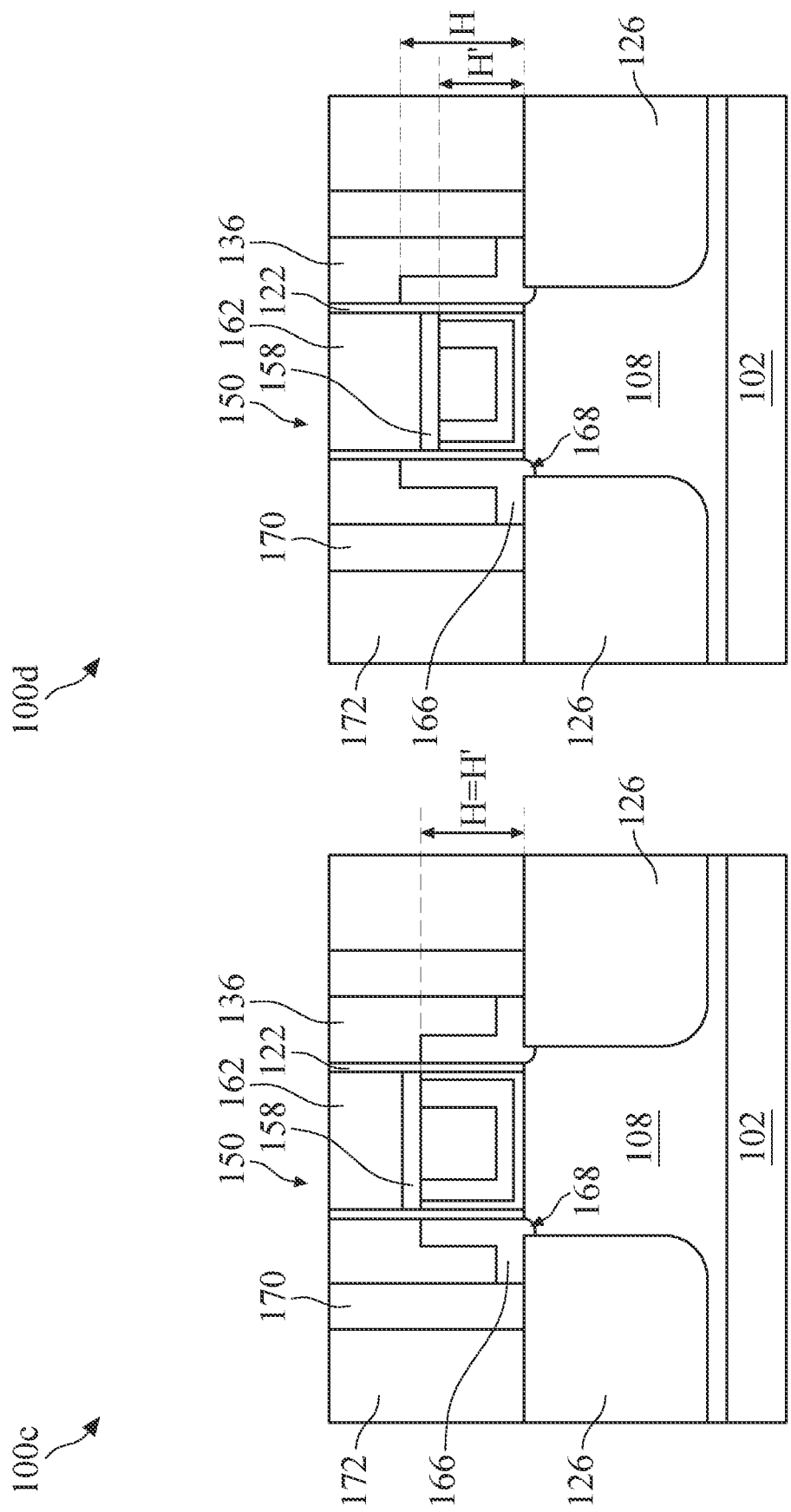

SEMICONDUCTOR DEVICE WITH AIR-GAP SPACERS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, it is important to reduce stray capacitance among features of field effect transistors, such as capacitance between a gate structure and source/drain contacts, in order to increase device switching speed, decrease switching power consumption, and/or decrease coupling noise of the transistors. Certain low-k materials, with a dielectric constant lower than that of silicon oxide, have been suggested as insulator materials that may provide lower relative permittivity to reduce stray capacitance. However, as semiconductor technology progresses to smaller geometries, the distances between the gate structure and source/drain contacts are further reduced, resulting in still large stray capacitance. Therefore, although existing approaches in transistor formation have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8, and 9 are perspective views of a semiconductor device constructed according to the method in FIGS. 1A-1C, in accordance with some embodiments.

FIGS. 10A, 10B, 11A, 11B, 12A, 12B, 13A, 13B, 14A, 14B, 15A, 15B, 16A, 16B, 17A, 17B, 18A, 18B, 19A, 19B, 20A, 20B, 21A, 21B, 22A, 22B, 23A, 23B, 24A, 24B, 25A, 25B, 26A, 26B, 27A, 27B, 28A, 28B, 29A, 29B, 30, 31, and 32 are cross-sectional views of a portion of a semiconductor device constructed according to the method in FIGS. 1A-1C, in accordance with some embodiments.

DETAILED DESCRIPTION

Figure 1A:
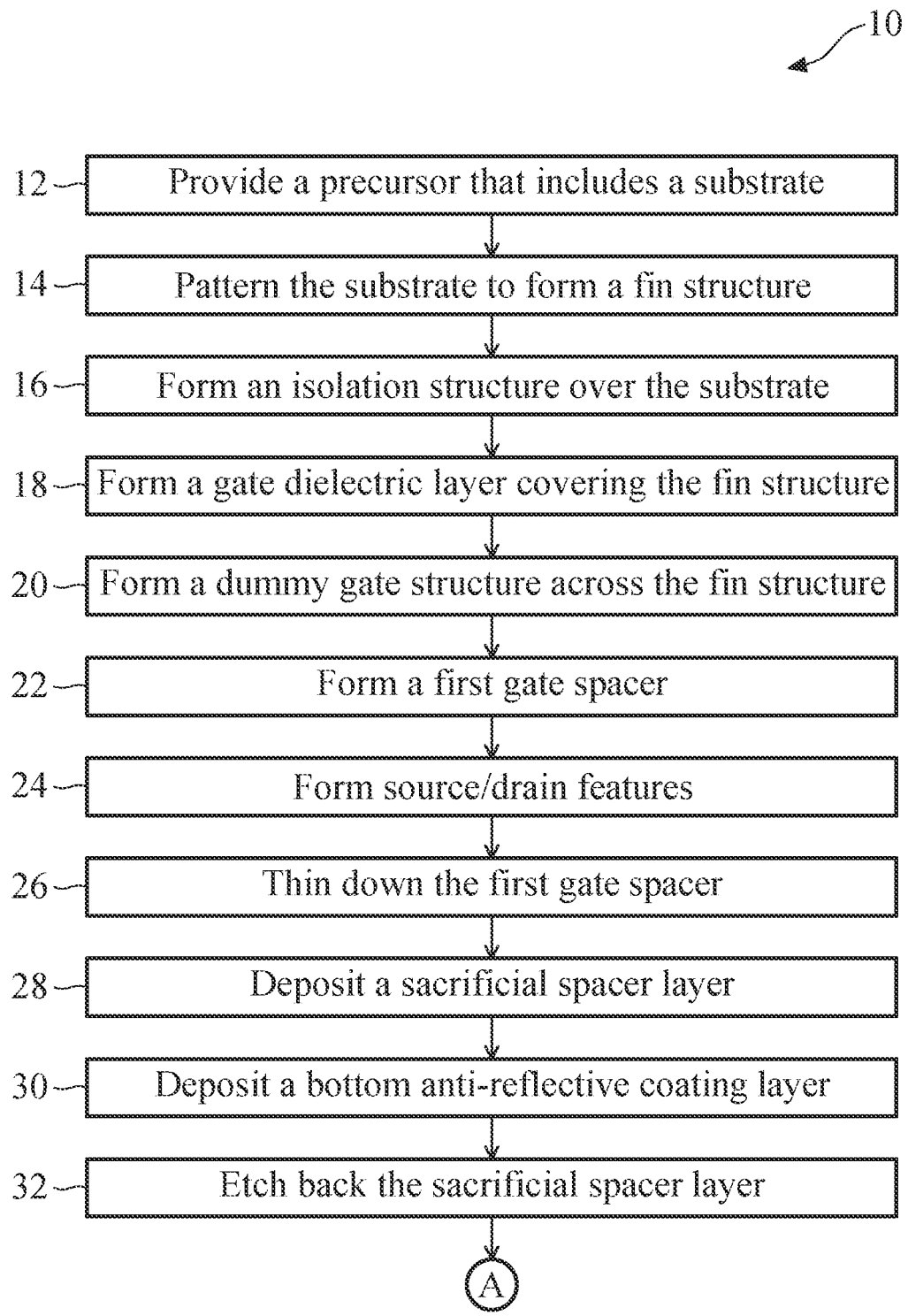
FIGS. 1A, 1B, and 1C illustrate a flow chart of a method of forming a semiconductor device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices and methods of forming the same. More particularly, the present disclosure is related to providing methods and structures in semiconductor manufacturing for lowering stray capacitance between a gate structure and source/drain contacts of a field effect transistor (FET), such as a fin-like FET (FinFET) or a gate-all-around (GAA) transistor. In the forming of FETs, it is important to increase device switching speed, decrease switching power consumption, and decrease coupling noise. Stray capacitance generally has a negative impact on these parameters, especially from stray capacitance between a gate structure and source/drain contacts. As semiconductor technology progresses to smaller geometries, the distances between gate structures and source/drain contacts shrink, resulting in larger stray capacitance. Consequently, with transistor dimensions are continually scaled down to sub-10 nm technology nodes and below, stray capacitance in FETs has become more problematic. The present disclosure aims at providing solutions in forming spacers containing air gaps (or referred to as air-gap spacers) interposing a gate structure and the source/drain contacts, instead of spacers conventionally made of a solid dielectric material, in an effort of lowering relative permittivity (or dielectric constant) between the gate structure and source/drain contacts and thereby lowering stray capacitance.

Figure 1B:
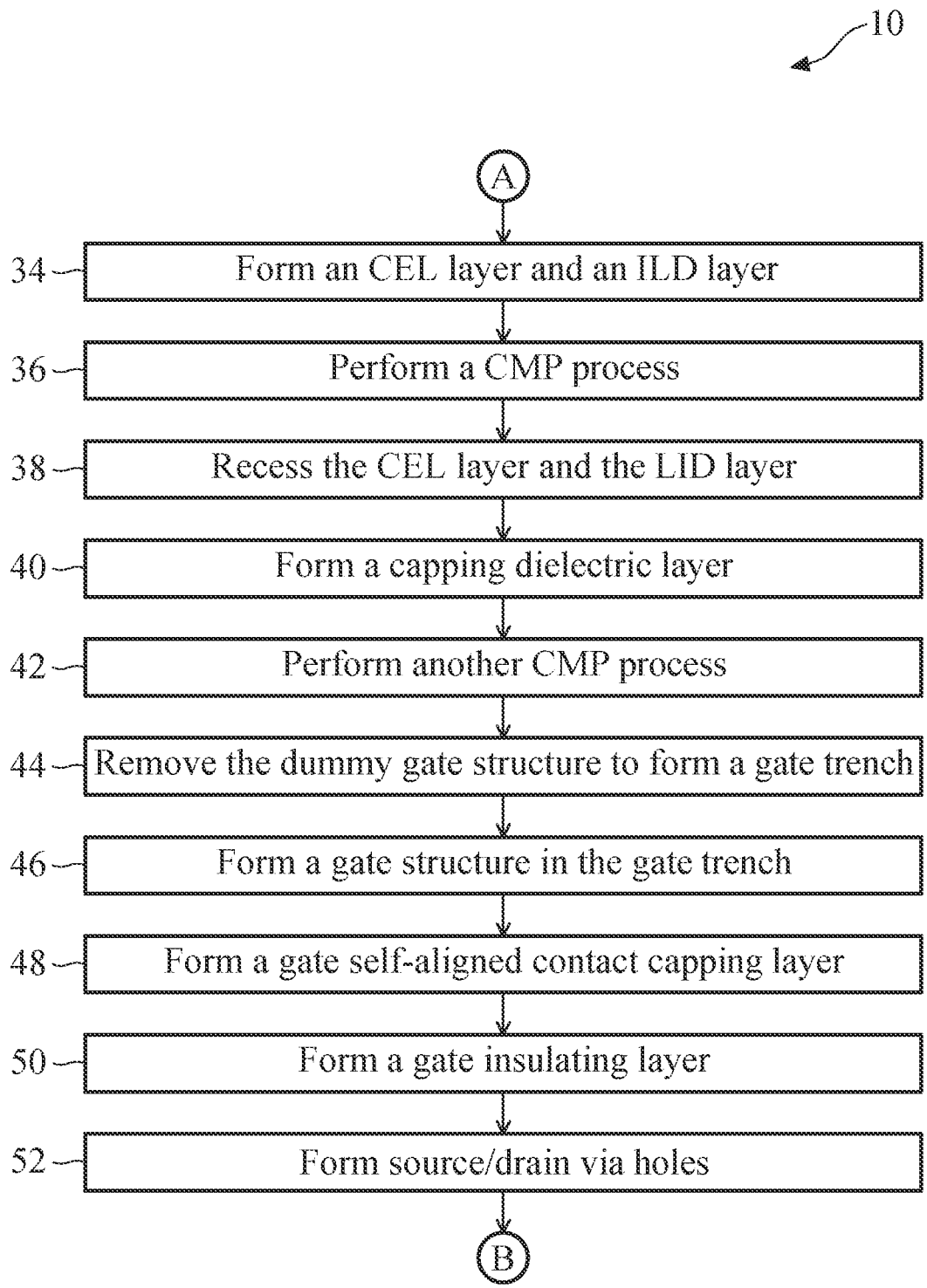
Figure 1C:
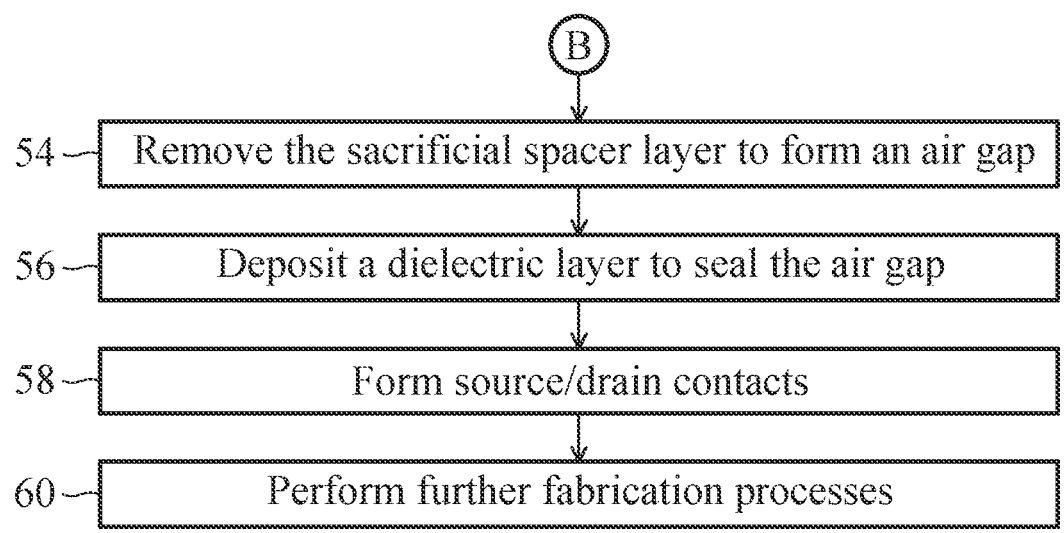

FIGS. 1A, 1B, and 1C illustrate a flow chart of a method 10 for forming semiconductor devices according to the present disclosure. The method 10 is an example, and is not intended to limit the present disclosure beyond what is explicitly recited in the claims. Additional operations can be provided before, during, and after the method 10, and some operations described can be replaced, eliminated, or relocated for additional embodiments of the method. The method 10 is described below in conjunction with FIGS. 2-31, which illustrate cross-sectional views of a semiconductor device during various fabrication steps according to some embodiments of the method 10. The semiconductor device may be an intermediate device fabricated during processing of an integrated circuit (IC), or a portion thereof, that may comprise static random access memory (SRAM) and/or logic circuits, passive components such as resistors, capacitors, and inductors, and active components such as p-type FETs (pFETs), n-type FETs (nFETs), FinFETs, metal-oxide semiconductor field effect transistors (MOSFET), and complementary metal-oxide semiconductor (CMOS) transistors, bipolar transistors, high voltage transistors, high frequency transistors, other memory cells, and combinations thereof. Furthermore, the various features including transistors, gate stacks, active regions, isolation structures, and other features in various embodiments of the present disclosure are provided for simplification and ease of understanding and do not necessarily limit the embodiments to any types of devices, any number of devices, any number of regions, or any configuration of structures or regions.

At operation 12, the method 10 (FIG. 1A) provides a precursor of the semiconductor device 100a, as shown in FIG. 2. For the convenience of discussion, the precursor of the semiconductor device 100 is also referred to as the device 100a. The device 100a may include a substrate 102 and various features formed therein or thereon. The substrate 102 may be a semiconductor wafer such as a silicon wafer. Alternatively or additionally, the substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP. In addition, the substrate 102 may include structures such as doped regions, interlayer dielectric (ILD) layers, conductive features, and/or isolation structures. Furthermore, the substrate 102 may further include single or multiple material layers to be patterned. For example, the material layers may include a silicon layer, a dielectric layer, and/or a doped poly-silicon layer.

Still referring to FIG. 2, a dielectric layer 104 is formed over the substrate 102, and a hard mask layer 106 is formed over the dielectric layer 104 in accordance with some embodiments. The dielectric layer 104 may be used as an adhesion layer between the substrate 102 and the hard mask layer 106. In addition, the dielectric layer 104 may also be used as an etch stop layer for etching the hard mask layer 106. In some embodiments, the dielectric layer 104 is made of silicon oxide. The dielectric layer 104 may be formed by using a thermal oxidation process, although other deposition processes may be used in some other embodiments. The hard mask layer 106 may be used as a hard mask during subsequent photolithography processes. In some embodiments, the hard mask layer 106 is made of silicon nitride. The hard mask layer 106 may be formed by using low-pressure chemical vapor deposition (LPCVD) or plasma enhanced chemical vapor deposition (PECVD), although other deposition processes may also be used in some other embodiments.

Figure 3:
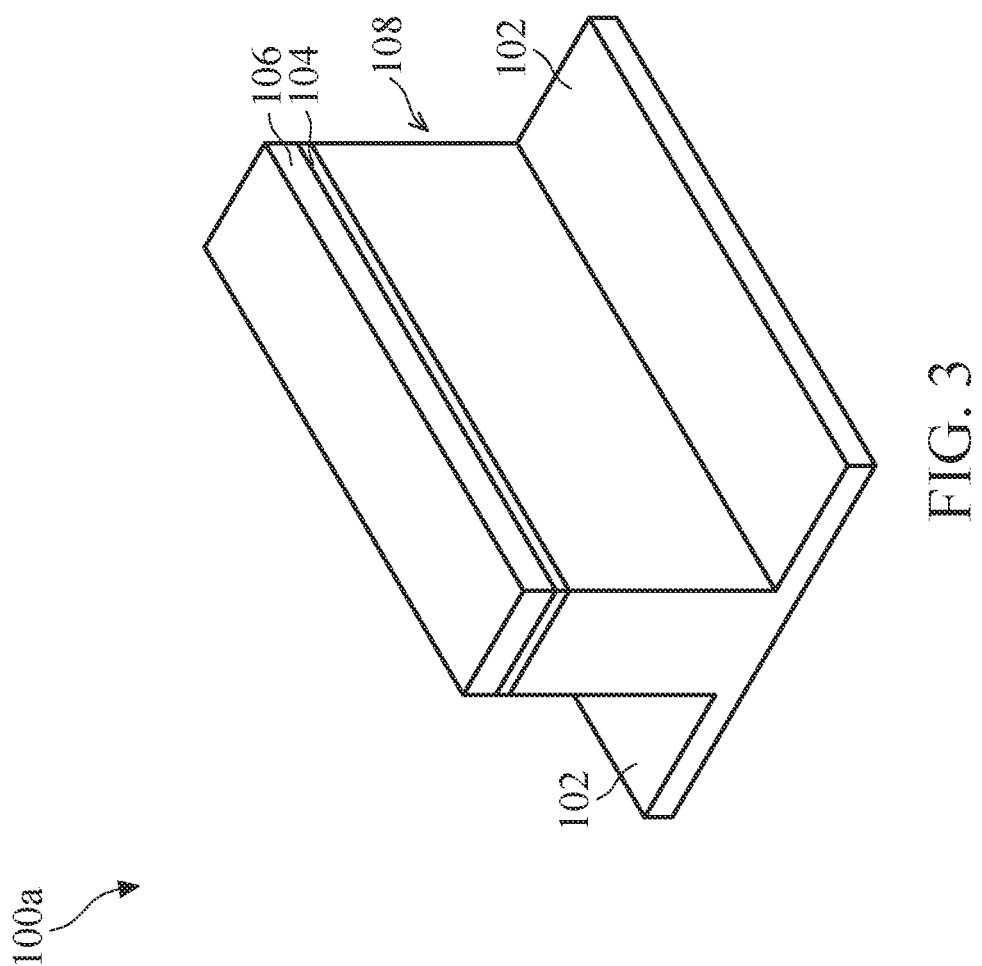

At operation 14, the method 10 (FIG. 1A) forms a fin structure 108 by patterning the hard mask layer 106, the dielectric layer 104, and the substrate 102, as shown in FIG. 3. In some embodiments, the fin structure 108 is formed by forming a photoresist layer (not shown) over the hard mask layer 106 and sequentially etching the hard mask layer 106, the dielectric layer 104, and the substrate 102. In some embodiments, the method 10 patterns the substrate 102 using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the substrate 102 in an etching process, such as a dry etching (e.g., reactive ion etching), a wet etching, and/or other suitable process.

Figure 4:
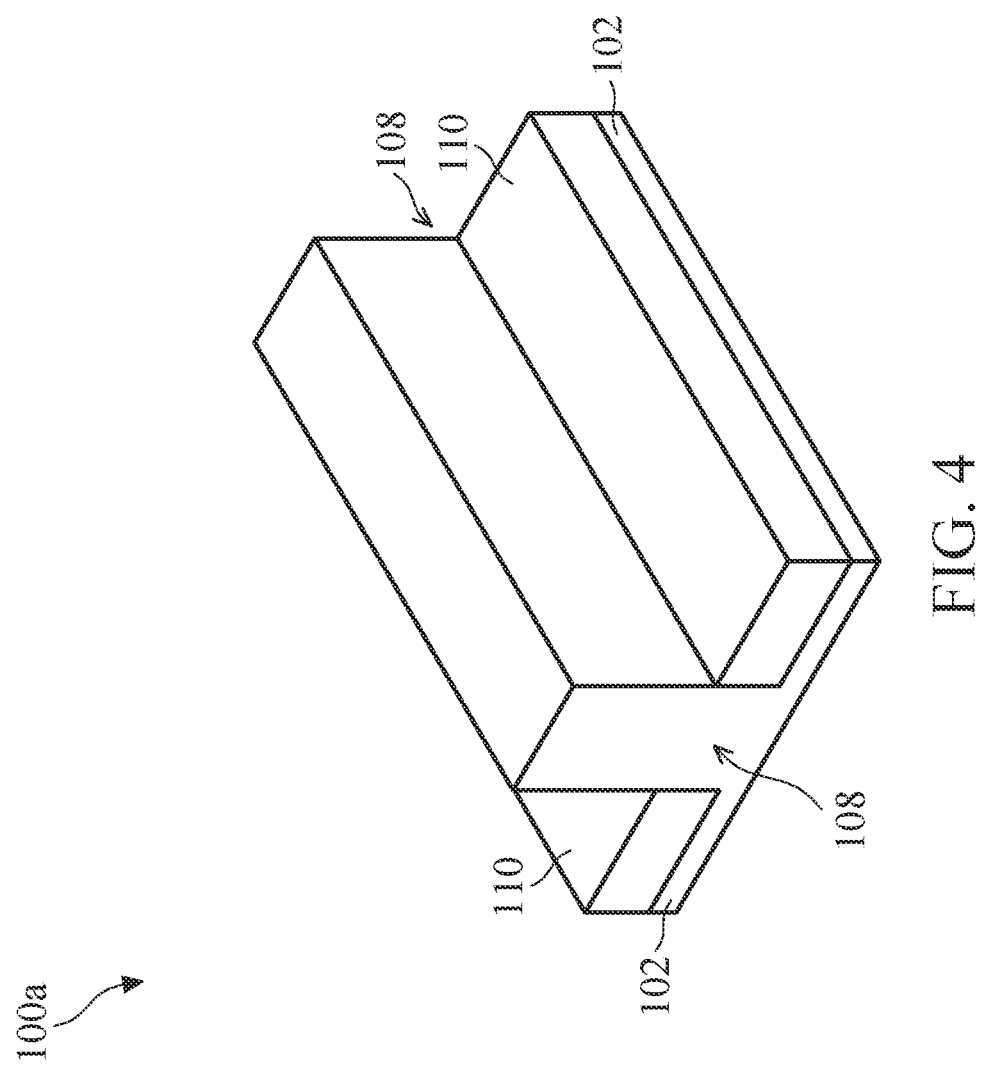

At operation 16, the method 10 (FIG. 1A) forms an isolation structure 110 over the substrate 102 and surrounding the fin structure 108, as shown in FIG. 4. In addition, the dielectric layer 104 and the hard mask layer 106 are removed. The isolation structure 110 may be formed by depositing an insulating layer over the substrate 102 and recessing the insulating layer. In some embodiments, the isolation structure 110 is made of silicon oxide, silicon nitride, silicon oxynitride, fluoride-doped silicate glass (FSG), or other low-k dielectric materials.

Figure 5:
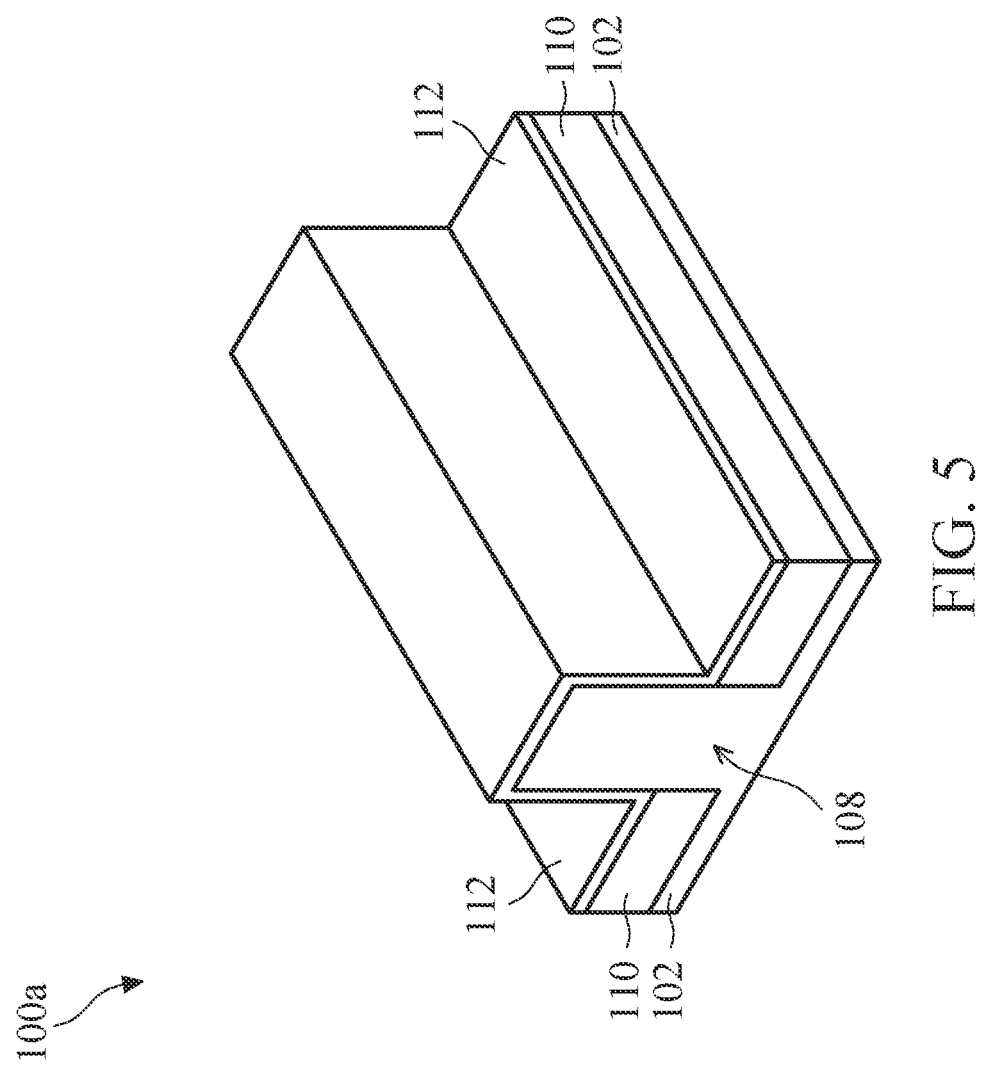

At operation 18, the method 10 (FIG. 1A) forms a gate dielectric layer 112 over the substrate 102 to cover the fin structure 108 and the isolation structure 110, as shown in FIG. 5. In some embodiments, the gate dielectric layer 112 is a dummy gate dielectric layer. In some embodiments, the gate dielectric layer 112 is made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HMO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials.

Figure 6:
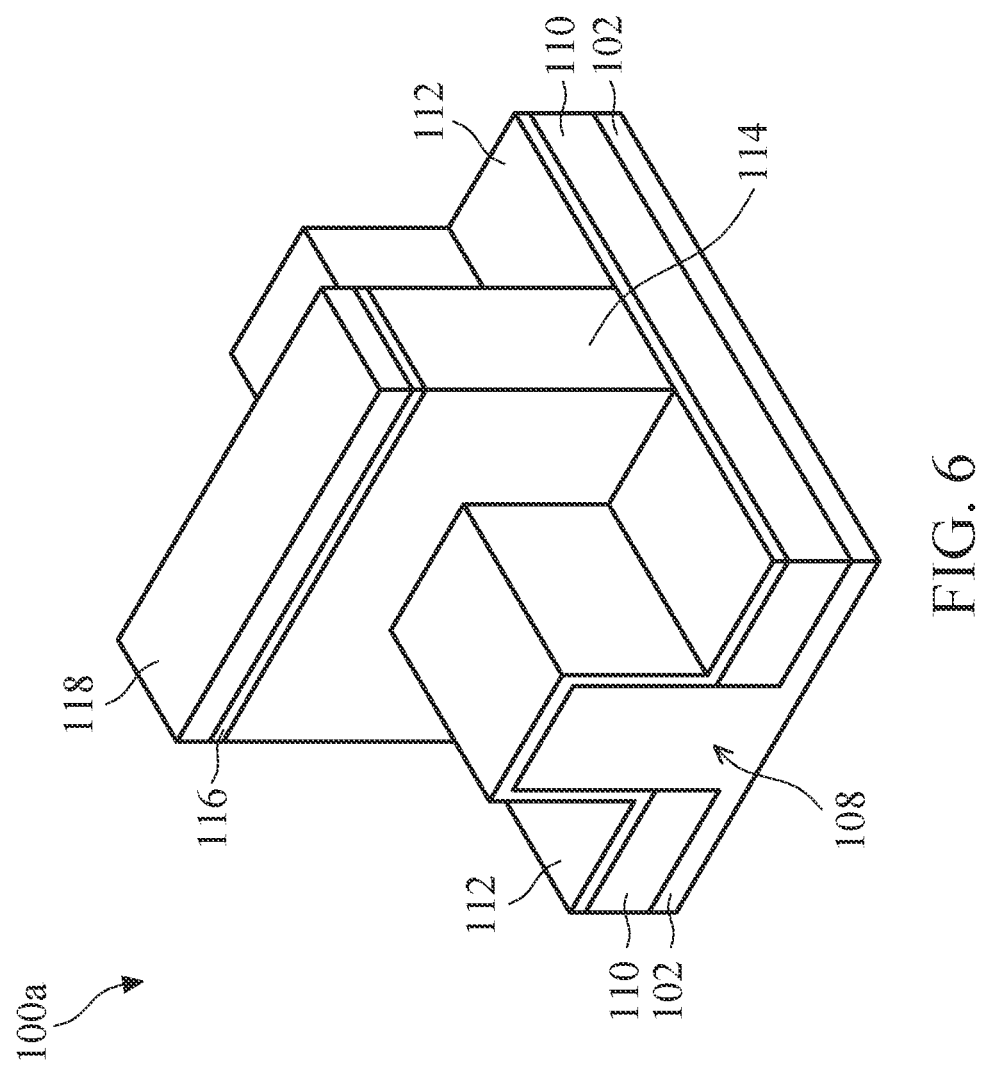
Figure 7:
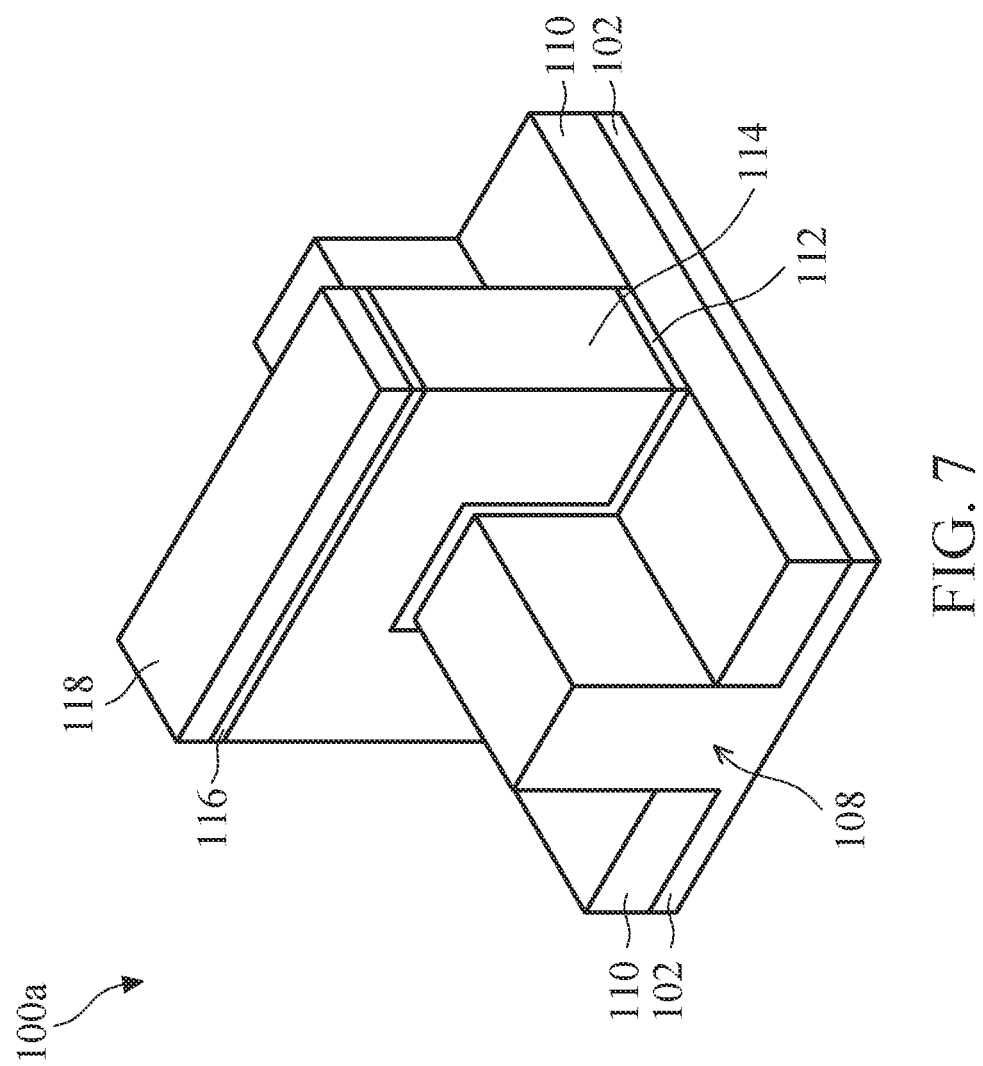

At operation 20, the method 10 (FIG. 1A) forms a dummy gate structure 114 across the fin structure 108 and extending over the isolation structure 110, as shown in FIG. 6. In some embodiments, the dummy gate structure 114 is made of polysilicon. In some embodiments, a dielectric layer 116 and a hard mask layer 118 are positioned over the dummy gate structure 114. Materials and methods used to form the dielectric layer 116 and the hard mask layer 118 may be similar to those used to make the dielectric layer 104 and the hard mask layer 106 and are not repeated herein. The method 10 at operation 20 also removes portions of the gate dielectric layer 112 that are not covered by the dummy gate structure 114 in an etching process, such as a dry etching (e.g., reactive ion etching), a wet etching, and/or other suitable process. The resultant structure after operation 20 is shown in FIG. 7.

Figure 8:
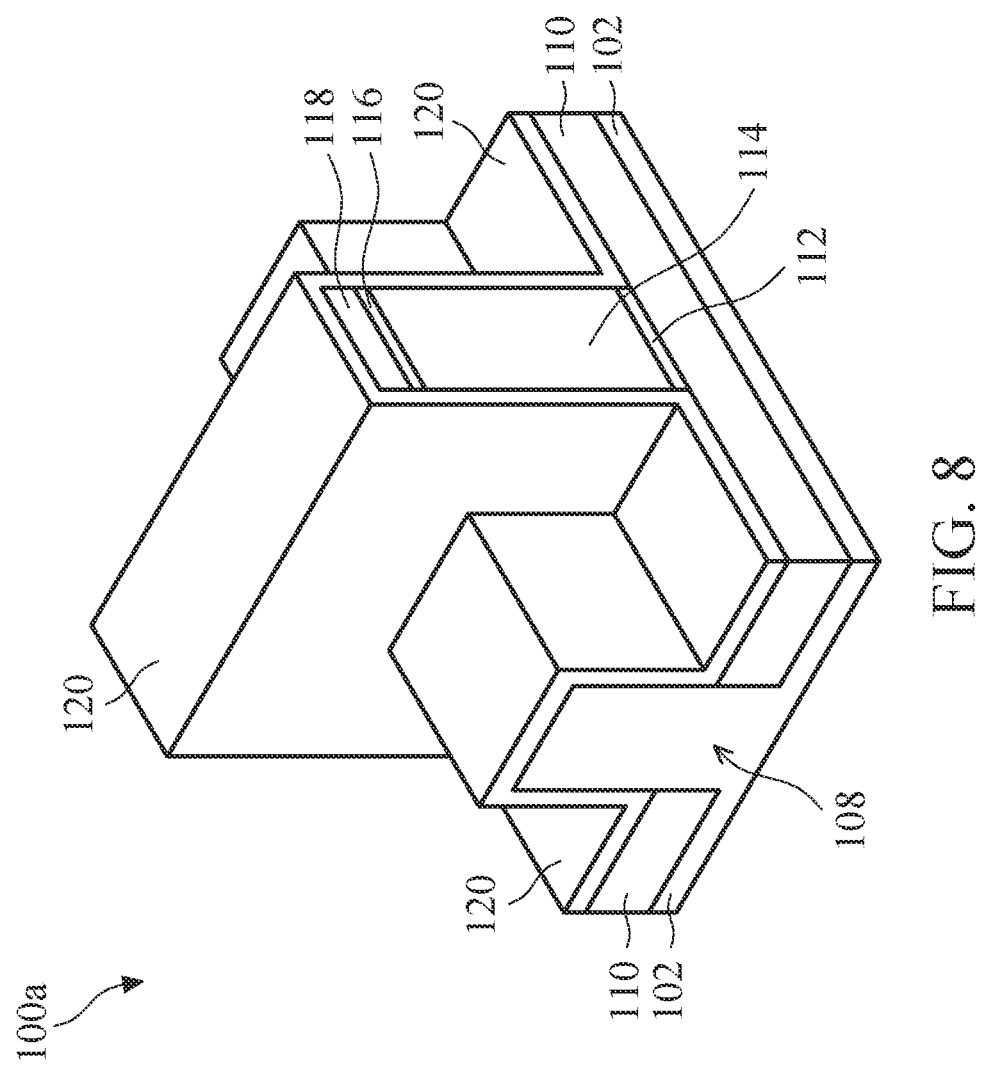

At operation 22, the method 10 (FIG. 1A) forms a first gate spacer on sidewalls of the dummy gate structure 114. Referring to FIG. 8, in some embodiments, the method 10 first deposits a spacer layer 120 over the substrate 102. More specifically, the spacer layer 120 covers the sidewalls of the dummy gate structure 114, the top surface of the isolation structure 110, and the sidewalls and top surface of the fin structure 108. In some embodiments, the spacer layer 120 is made of silicon oxycarbide (SiOC), silicon oxycarbonnitride (SiOCN), silicon nitride, silicon oxide, silicon oxynitride, silicon carbide, or other applicable dielectric materials. In some embodiments, the thickness of the spacer layer 120 is in a range from about 4 nm to about 12 nm.

Figure 9:
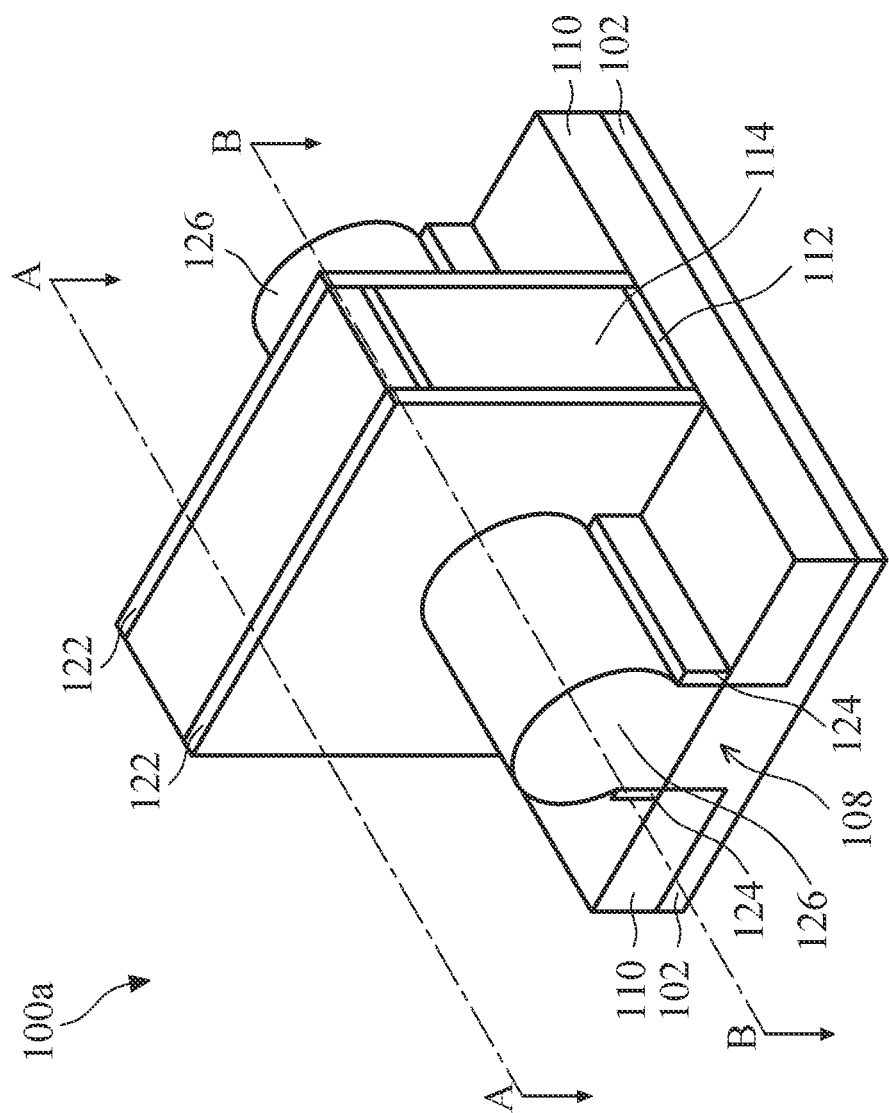

Referring to FIG. 9, after the spacer layer 120 is formed, the method 10 at operation 22 performs an etching process to form a first gate spacer 122 on the sidewalls of the dummy gate structure 114 and to form a fin spacer 124 on the sidewalls of the fin structure 108. The etching process may be a dry etching (e.g., reactive ion etching), a wet etching, and/or other suitable process. As described previously, the first gate spacer 122 may be made of silicon oxycarbide (SiOC), silicon oxycarbonnitride (SiOCN), silicon nitride, silicon oxide, silicon oxynitride, silicon carbide, or other applicable dielectric materials, and the thickness of the first gate spacer 122 may be in a range from about 4 nm to about 12 nm.

Still referring to FIG. 9, at operation 24, the method 10 (FIG. 1A) forms source/drain features 126 in the fin structure 108. The source/drain features 126 may be formed by recessing the fin structure 108 to form recesses and growing a strain material in the recesses. In some embodiments, the source/drain features 126 are formed by an epitaxial growth method using CVD, ALD or molecular beam epitaxy (MBE). In addition, the lattice constant of the strained material may be different from the lattice constant of the substrate 102. In some embodiments, the source/drain features 126 include Ge, SiGe, InAs, InGaAs, InSb, GaAs, GaSb, InAlP, InP, or the like. The cross-sectional views of the resultant structure after operation 24 are shown in FIGS. 10A and 10B, respectively, in which FIG. 10A is a cut along A-A line through the fin structure 108 and FIG. 10B is a cut along B-B line through the isolation structure 110. A dotted line 129 in FIG. 10A marks a position of the interface between the isolation structure 110 and the substrate 102. A channel region 130 is defined under the dummy gate structure 114 and interposed between a pair of the source/drain features 126. The channel region 130 conducts currents between the respective source/drain features 126 when the transistor turns on.

At operation 26, the method 10 (FIG. 1A) thins down the first gate spacer 122, as shown in FIGS. 11A and 11B, which are cross-sectional views along A-A line and B-B line in the FIG. 9, respectively. In some embodiments, the thinning of the first gate spacer 122 includes an etching process. The etching process may be a dry etching (e.g., reactive ion etching), a wet etching, and/or other suitable process. In some embodiments, the etching process may be performed using the same or similar process conditions and etchant gases as operation 22, for example, the etching process may be an anisotropic etching, although different process conditions may be used. Portions of the top and sidewall surfaces of the fin structure 108 previously covered by the first gate spacer 122 are exposed after the thinning process. After operation 26, the reduced thickness of the first gate spacer 122 may be in a range from about 1 nm to about 2 nm. The remaining portions of the first gate spacer 122 protect the dummy gate structure 114 from being over-etched in subsequent etching processes. Accordingly, the first gate spacer 122 is also referred to as a seal spacer 122. Alternatively, the seal spacer 122 may be completely removed in some embodiments.

At operation 28, the method 10 (FIG. 1A) deposits a sacrificial spacer layer 132 on sidewalls of the seal spacer 122 (or the dummy gate structure 114 if the seal spacer 122 is removed at operation 26) and over the source/drain features 126, the isolation structure 110, and exposed portions of the fin structure 108, as shown in FIGS. 12A and 12B, which are cross-sectional views along A-A line and B-B line in the FIG. 9, respectively. In some embodiments, the sacrificial spacer layer 132 includes silicon oxide ($SiO_2$), aluminum oxide (AlO), silicon nitride (SiN), silicon oxynitride (SiON), silicon carbonitride (SiCN), silicon carbon oxynitride (SiCON). Generally, the composition of the seal spacer 122 and the sacrificial spacer layer 132 are selected such that there is a high etch selectivity therebetween. The sacrificial spacer layer 132 will be removed in subsequent operations of the method 10 to form a void as an air gap, while the seal spacer 122 is substantially remained (if not removed at operation 26). The forming of the air gap will be further described in details later. In an example, the sacrificial spacer layer 132 is formed by blanket depositing a dielectric layer (e.g., a silicon nitride layer having a substantially uniform thickness) by a CVD process. In some embodiments, the sacrificial spacer layer 132 has a thickness in a range from about 1 nm to about 5 nm.

At operation 30, the method 10 (FIG. 1A) deposits a bottom anti-reflective coating (BARC) layer 134 over the horizontal portion of the sacrificial spacer layer 132 and covering a lower portion of the sidewalls of the sacrificial spacer layer 132, as shown in FIGS. 13A and 13B, which are cross-sectional views along A-A line and B-B line in the FIG. 9, respectively. In some embodiments, the BARC layer 134 is a photoresist layer. In some embodiments, the BARC layer 134 is made of amorphous carbon. The BARC layer 134 may be first deposited by spin coating, although other coating processes may alternatively be used. Next, an etching-back process is performed to recess the BARC layer 134 to a determined height (e.g., by controlling the etching time), such that an upper portion of the sidewalls of the sacrificial spacer layer 132 is exposed.

At operation 32, the method 10 (FIG. 1A) performs another etching-back process to remove top portions of the sacrificial spacer layer 132 that are not covered by the BARC layer 134, as shown in FIGS. 14A and 14B, which are cross-sectional views along A-A line and B-B line in the FIG. 9, respectively. After the etching-back process, the lower portion of the sacrificial spacer layer 132 remains. The height H of the lower portion of the sacrificial spacer layer 132 may be determined by the height of the BARC layer 134. In some embodiments, the height H of the lower portion of the sacrificial spacer layer 132 is substantially equal to the height of BARC layer 134. In some embodiments, the height H is in a range from about 20 nm to about 60 nm. The height H may affect the relatively height between the to-be-formed air gap and the metal gate structure, and the related details will be described later. After the sacrificial spacer layer 132 is etched back, the BARC layer 134 is removed in a suitable process such as etching, resist stripping or plasma ashing. In addition, as shown in FIGS. 14A and 14B, upper portions of the seal spacer 122 (or the dummy gate structure 114 if the seal spacer 122 is removed at operation 26) are also exposed after the etched back process is performed.

Figures 15A, 15B:
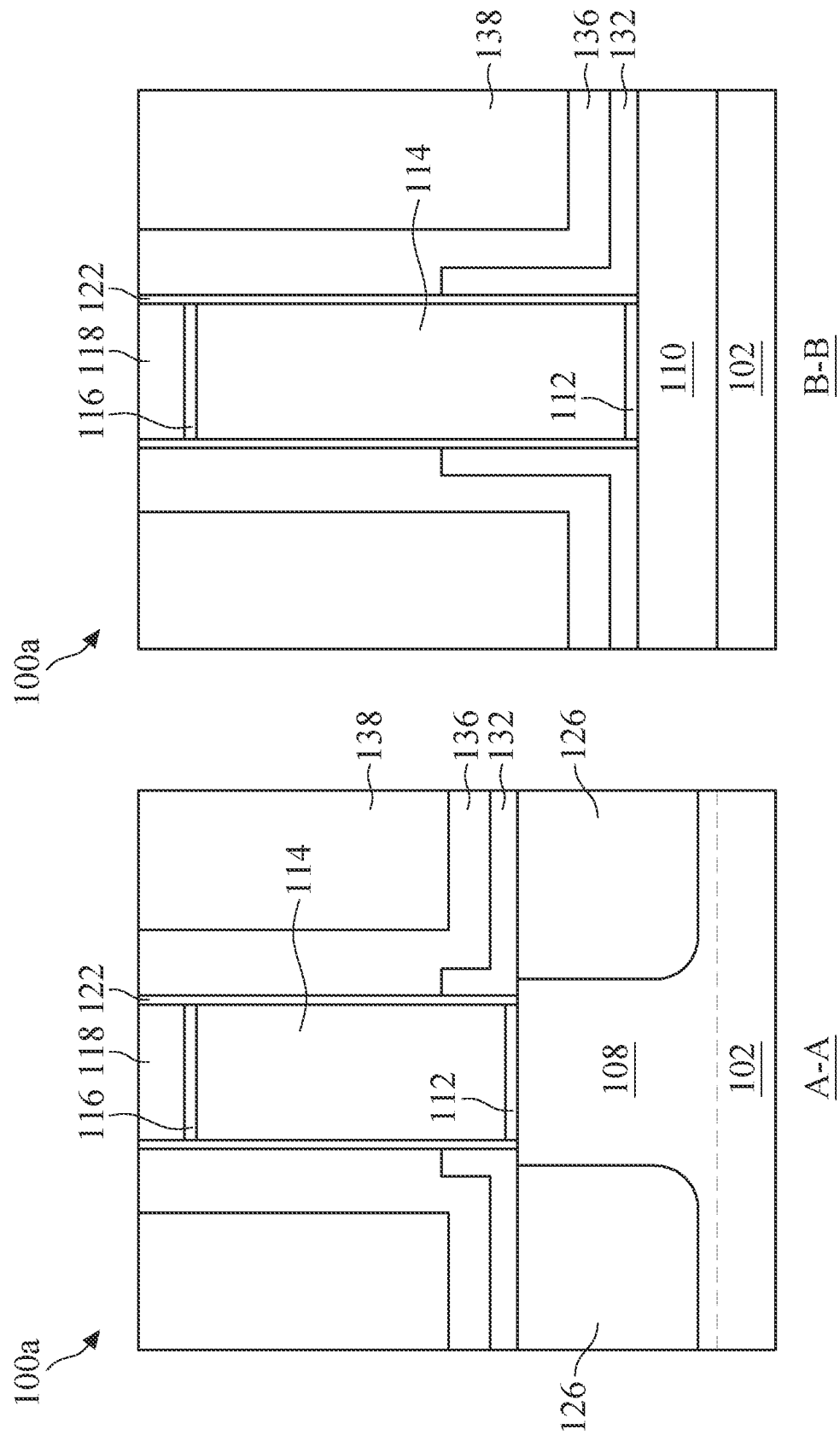

At operation 34, the method 10 (FIG. 1B) deposits a contact etch stop (CES) layer 136 covering the seal spacer 122 and the sacrificial spacer layer 132 and an inter-layer dielectric (ILD) layer 138 over the CES layer 136, as shown in FIGS. 15A and 15B, which are cross-sectional views along A-A line and B-B line in the FIG. 9, respectively. The CES layer 136 may include a dielectric material such as silicon nitride (SiN), silicon oxide ($SiO_2$), silicon oxynitride (SiON), silicon carbonitride (SiCN), silicon carbon oxynitride (SiCON), other dielectric materials, or combination thereof. The CES layer 136 may be formed by a plasma-enhanced CVD (PECVD) process, low pressure CVD (LPCVD), ALD, or other suitable deposition or oxidation processes. The ILD layer 138 may include materials such as or silicon oxide, doped silicon oxide such as borophosphosilicate glass (BPSG), tetraethylorthosilicate (TEOS) oxide, un-doped silicate glass, fused silica glass (FSG), phosphosilicate glass (PSG), boron doped silicon glass (BSG), low-k dielectric material, and/or other suitable dielectric materials. The ILD layer 138 may be deposited by a PECVD process, a flowable CVD (FCVD) process, or other suitable deposition technique. The compositions of the CES layer 136 and the ILD layer 138 are selected such that the CES layer 136 has some etch selectivity as compared to the ILD layer 138. Further, The compositions of the CES layer 136 and the sacrificial spacer layer 132 are selected such that the sacrificial spacer layer 132 has some etch selectivity as compared to the CES layer 136. In an embodiment, the CES layer 136 is deposited as a blanket layer and the ILD layer 138 is deposited over the CES layer 136. In various embodiments, a thickness of the CES layer 136 may be thinner, thicker, or equal to that of the sacrificial spacer layer 132. In the illustrated embodiment, the CES layer 136 is thicker than the sacrificial spacer layer 132 for a better blanket covering at corner regions.

Subsequently, the method 10 (FIG. 1B) proceeds to operation 36 by performing a polishing process to remove some portions of the ILD layer 138 and the CES layer 136 until the dielectric layer 116 is exposed, as shown in FIGS. 16A and 16B, which are cross-sectional views along A-A line and B-B line in the FIG. 9, respectively. In some embodiments, a chemical mechanical planarization (CMP) process is performed.

At operation 38, the method 10 (FIG. 1B) recesses the CES layer 136 and the ILD layer 138 to expose upper portions of the seal spacer 122, as shown in FIGS. 17A and 17B, which are cross-sectional views along A-A line and B-B line in the FIG. 9, respectively. A top surface of the CES layer 136 and the ILD layer 138 may be lower than a top surface of the dielectric layer 116 for about 5 nm to about 30 nm. Any suitable etching technique may be used to recess the CES layer 136 and the ILD layer 138, including dry etching, wet etching, RIE, and/or other etching methods, and in an exemplary embodiment, an anisotropic dry etching is used to selectively remove the dielectric materials of the CES layer 136 and the ILD layer 138 without etching the seal spacer 122. The CES layer 136 and the ILD layer 138 is recessed for a determined distance (e.g., by controlling the etching time), such that the sacrificial spacer layer 132 remains fully covered by the CES layer 136.

At operation 40, the method 10 (FIG. 10) forms a capping dielectric layer 140 covering the CES layer 136, the ILD layer 138, the seal spacer 122, and the dielectric layer 116, as shown in FIGS. 18A and 18B, which are cross-sectional views along A-A line and B-B line in the FIG. 9, respectively. In some embodiments, the capping dielectric layer 140 includes a dielectric material such as silicon nitride (SiN), silicon oxide ($SiO_2$), silicon oxynitride (SiON), silicon carbonitride (SiCN), silicon carbon oxynitride (SiCON), other dielectric materials, or combination thereof. The capping dielectric layer 140 may be formed by a PECVD process, a FCVD process, or other suitable deposition processes. In some embodiments, the capping dielectric layer 140 includes different material composition from the ILD layer 138 to provide etching protection in subsequent etching processes.

Subsequently, the method 10 (FIG. 1B) proceeds to operation 42 by performing another polishing process to remove some portions of the capping dielectric layer 140 until the dummy gate structure 114 is exposed, as shown in FIGS. 19A and 19B, which are cross-sectional views along A-A line and B-B line in the FIG. 9, respectively. In some embodiments, a chemical mechanical planarization (CMP) process is performed.

At operation 44, the method 10 (FIG. 1B) removes the dummy gate structure 114 to form a gate trench 142, as shown in FIGS. 20A and 20B, which are cross-sectional views along A-A line and B-B line in the FIG. 9, respectively. The gate trench 142 exposes the fin structure 108 in the channel region. The seal spacer 122 protects the sacrificial spacer layer 132, the CES layer 136, and the source/drain features 126 during the removal of the dummy gate structure 114. The dummy gate structure 114 can be removed using plasma dry etching and/or wet etching. When the dummy gate structure 114 is polysilicon and the seal spacer 122 is an oxide, a wet etchant such as a TMAH solution can be used to selectively remove the dummy gate structure 114. It should be noted that, although the gate dielectric layer 112 is removed in FIGS. 20A and 20B, it may not be removed in some other embodiments.

At operation 46, the method 10 (FIG. 1B) replaces the dummy gate structure 114 by filling the gate trench 142 with a gate structure 150 (or referred to as a metal gate structure 150), as shown in FIGS. 21A and 21B, which are cross-sectional views along A-A line and B-B line in the FIG. 9, respectively. In some embodiments, the gate structure 150 includes a gate dielectric layer 152, a work function metal layer 154, and a gate electrode layer 156. In some embodiments, the gate dielectric layer 152 is made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HMO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. The work function metal layer 154 is formed over the gate dielectric layer 152 in accordance with some embodiments. The work function metal layer 154 is customized to have the proper work function. For example, if a P-type work function metal (P-metal) for a PMOS device is desired, TiN, WN, or W may be used. On the other hand, if an N-type work function metal (N-metal) for NMOS devices is desired, TiAl, TiAlN, or TaCN, may be used. The gate electrode layer 156 is formed over the work function metal layer 154 in accordance with some embodiments. In some embodiments, the gate electrode layer 156 is made of a conductive material, such as aluminum, copper, tungsten, titanium, tantalum, or other applicable materials. The gate dielectric layer 152, the work function metal layer 154, and the gate electrode layer 156 may be formed by any applicable process to any applicable thickness. It should be noted that additional layers may be formed above and/or below the gate dielectric layer 152, the work function metal layer 154, and gate electrode layer 156, such as liner layers, interface layers, seed layers, adhesion layers, barrier layers, or the like. In addition, the gate dielectric layer 152, the work function metal layer 154, and the gate electrode layer 156 may include more than one layer made of various materials.

At operation 48, the method 10 (FIG. 1B) forms a gate self-aligned contact (SAC) capping layer 158 disposed over the gate structure 150, as shown in FIGS. 22A and 22B, which are cross-sectional views along A-A line and B-B line in the FIG. 9, respectively. In some embodiments, an upper portion of the gate structure 150 is etched back to define a trench 160 between the seal spacer 122. In furtherance of the embodiments, the etching back process of the gate structure 150 is a wet etching process. In an example, an etchant used in the wet etching process is phosphoric acid. The remaining height H' of the recessed gate structure 150 is in a range from about 15 nm to about 50 nm in some embodiments. In the illustrated embodiment, the gate dielectric layer 152, the work function metal layer 154, and the gate electrode layer 156 are recessed below the top surface of the sacrificial spacer layer 132 (H'<H). It should be noted that, in various embodiments, the top surface of the recessed gate structure 150 may be leveled (or coplanar) with the top surface of the sacrificial spacer layer 132 (H'=H) or higher than the top surface of the sacrificial spacer layer 132 (H'>H). The remaining height H' of the recessed gate structure 150 may be chosen based on device performance considerations.

Still referring to FIGS. 22A and 22B, the method 10 at operation 48 (FIG. 1B) subsequently forms the gate SAC capping layer 158 over the recessed gate structure 150, covering the gate dielectric layer 152, the work function metal layer 154, and the gate electrode layer 156. In some embodiments, the gate SAC capping layer 158 includes one or more of $La_2O_3$, $Al_2O_3$, SiOCN, SiOC, SiCN, $SiO_2$, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, and other suitable material(s). The gate SAC capping layer 158 may be deposited using CVD, ALD, PVD, or oxidation. In an embodiment, the gate SAC capping layer 158 is initially deposited in the trench 160, then recessed in an etching-back process to a determined thickness (e.g., by controlling the etching time). In the illustrated embodiment, a top surface of the gate SAC capping layer 158 is substantially leveled (or coplanar) with the top surface of the sacrificial spacer layer 132. Alternatively, the top surface of the gate SAC capping layer 158 may be above or below the top surface of the sacrificial spacer layer 132 in accordance with some embodiments.

Figures 23A, 23B:
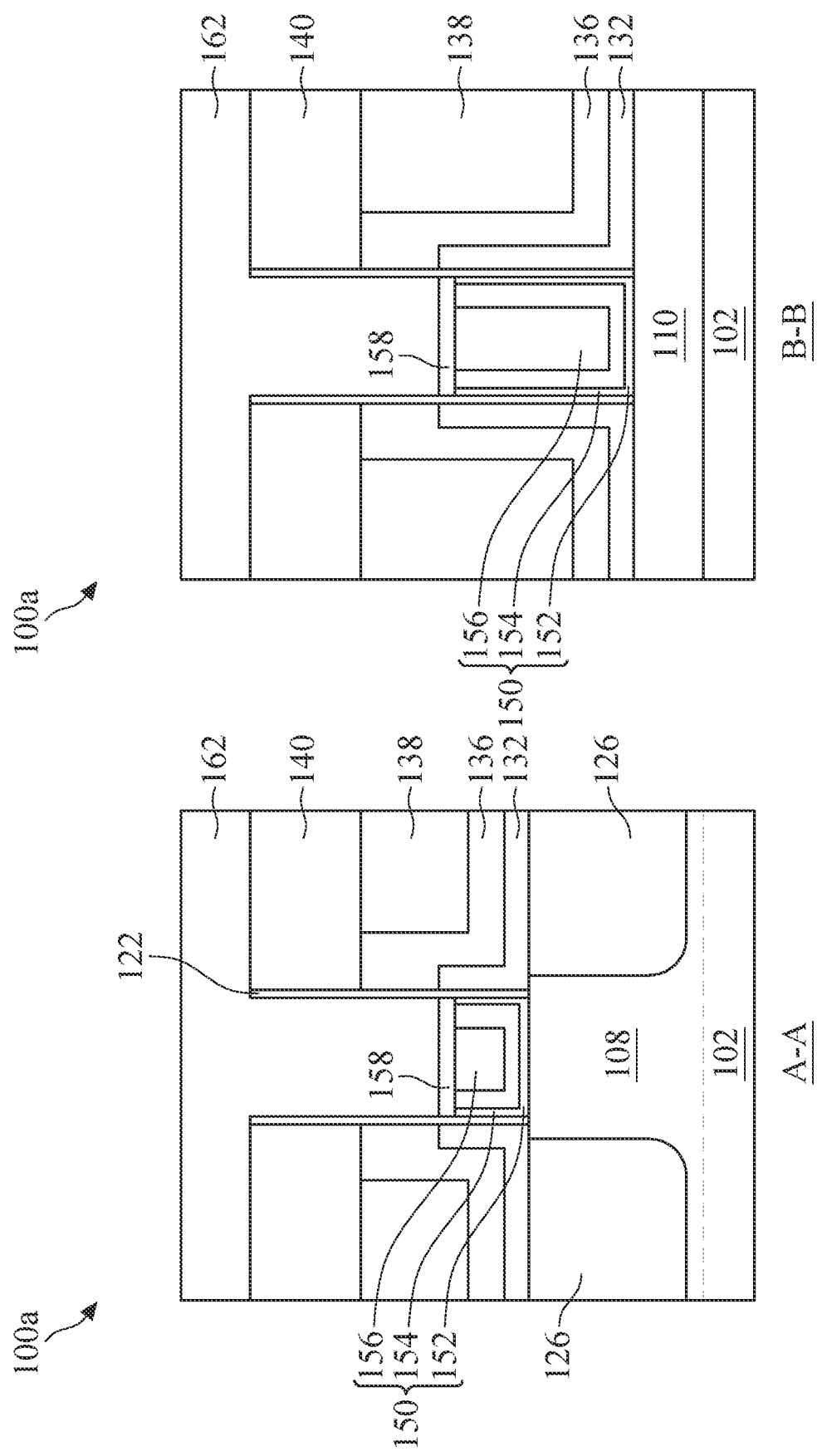

At operation 50, the method 10 (FIG. 1B) forms a gate insulating layer 162 over the gate SAC capping layer 158 and the capping dielectric layer 140, as shown in FIGS. 23A and 23B, which are cross-sectional views along A-A line and B-B line in the FIG. 9, respectively. In some embodiments, the gate insulating layer 162 may include a low-k dielectric material such as a dielectric material including Si, O, N, and C. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SILK (Dow Chemical, Midland, Michigan), polyimide, or combinations thereof. The gate insulating layer 162 may be deposited by using low-pressure chemical vapor deposition (LPCVD) or plasma enhanced chemical vapor deposition (PECVD), although other deposition processes may also be used in some other embodiments. Subsequently, the method 10 performs a polishing process to remove excessive portions of the gate insulating layer 162 and the capping dielectric layer 140 until the CES layer 136 and the ILD layer 138 are exposed, as shown in FIGS. 24A and 24B, which are cross-sectional views along A-A line and B-B line in the FIG. 9, respectively. In some embodiments, a chemical mechanical planarization (CMP) process is performed. In embodiments, the gate insulating layer 162 may have a thickness in a range of about 3 nm to about 30 nm after operation 50, for example.

At operation 52, the method 10 (FIG. 1B) patterns the ILD layer 138 to form source/drain contact holes 164 over the source/drain features 126 and the isolation structure 110, as shown in FIGS. 25A and 25B, which are cross-sectional views along A-A line and B-B line in the FIG. 9, respectively. In an embodiment, the method 10 at operation 52 includes a photolithography process and etching processes. The photolithography process may include forming a photoresist (or resist) over the ILD layer 138, exposing the resist to a pattern that defines various geometrical shapes for the source/drain contact holes 164, performing post-exposure bake processes, and developing the resist to form a masking element including the resist. The masking element, or a derivative thereof, is then used for etching recesses into the ILD layer 138. The masking element (e.g., a patterned resist) is subsequently removed. The etching processes may include one or more dry etching processes, wet etching processes, and other suitable etching techniques. For example, the etching processes may include a two-step etching. The first etching step removes portions of the ILD layer 138 to expose a horizontal portion of the CES layer 136, and the second etching step removes the horizontal portion of the CES layer 136 and horizontal portion of the sacrificial spacer layer 132, thereby exposing the source/drain features 126. In some embodiments, the ILD layer 138 is substantially completely removed at the operation 52. After operation 52, the vertical portion and part of the horizontal portion of the sacrificial spacer layer 132 remain under the CES layer 136, forming an L-shape. In the illustrated embodiment, the remaining horizontal portion has a width W that is smaller than the height H of the vertical portion. Depending on dimensions of the source/drain contact holes 164, the width W may be equal to or larger than the height H in some other embodiments. A vertical sidewall 132S at the bottom portion of the sacrificial spacer layer 132 is exposed in the source/drain contact holes 164.

At operation 54, the method 10 (FIG. 1C) performs an etching process with an etchant to selectively remove the sacrificial spacer layer 132 to form an L-shape air gap 166, as shown in FIGS. 26A and 26B, which are cross-sectional views along A-A line and B-B line in the FIG. 9, respectively. The method 10 at operation 54 may use a dry etching, a wet etching, or other suitable etching processes to etch the sacrificial spacer layer 132 through the sidewall 132S. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. In one example, the sacrificial spacer layer 132 contains silicon oxide and the wet etching process includes applying DHF. In another example, the sacrificial spacer layer 132 contains aluminum oxide and the wet etching process includes applying an ammonia and hydrogen peroxide mixture (APM) such as an SC1 solution ($NH_4OH:H_2O_2:H_2O$). In yet another example, the sacrificial spacer layer 132 contains silicon nitride and the wet etching process includes applying an acid containing $H_3PO_4$. The etching process starts from the sidewall 132S and etches into the bottom portion first then to the top portion of the sacrificial spacer layer 132. The etching process may create polymers as by-products. To avoid the polymers clogging the L-shape air gap 166, the etching process may be performed under an alleviated temperature that is above a vaporing point of the polymer. In one other embodiment, the etching and the heating may take turns in a cyclic process to drive the polymer out of the L-shape air gap 166. In yet another embodiment, the heating process is performed after the etching process has finished to evaporate the polymer out of the L-shape air gap 166. Further, since a portion of the top surface of the fin structure 108 is exposed at the corner regions of the L-shape air gap 166, a dip 168 may be formed due to limited etching contrast during the etching of the sacrificial spacer layer 132 in accordance with some embodiments. The dip 168 may have a depth ranging from about 0.2 nm to about 1.5 nm. As a comparison, the isolation structure 110 at the corner regions of the L-shape air gap 166 may remain substantially intact due to high etching contrast. Still further, in the illustrated embodiment, the top surface of the gate SAC capping layer 158 is substantially leveled (or coplanar) with the top surface of the L-shape air gap 166. Alternatively, the top surface of the gate SAC capping layer 158 may be above or below the top surface of the L-shape air gap 166 in accordance with some embodiments.

At operation 56, the method 10 (FIG. 1C) deposits a seal dielectric layer 170 to seal the L-shape air gap 166, as shown in FIGS. 27A and 27B, which are cross-sectional views along A-A line and B-B line in the FIG. 9, respectively. In an embodiment, the seal dielectric layer 170 is formed by ALD, CVD, PVD, coating process, and/or other suitable process. In an embodiment, the seal dielectric layer 170 is deposited by an ALD process. The formation of the seal dielectric layer 170 is tuned to effectively enclose the opening 132S, resulting in the sealed air gap 166. Respective air gap 166 is therefore enclosed below the CES layer 136 and horizontally between the seal spacer 122 and the CES layer 136 together with the seal dielectric layer 170. The surfaces of the seal spacer 122 (or the gate structure 150 if seal spacer 122 is removed at operation 26), the CES layer 136, the fin structure 108, the source/drain features 126, and the seal dielectric layer 170 are exposed in the air gap 166. A gas, such as a gas(es) used during the deposition of the dielectric material of the seal dielectric layer 170 or any other species that can diffuse into the air gap 166, may be in the air gap 166. Sealing the air gap 166 from an opening at its bottom portion mitigates air-gap volume shrinking otherwise caused by capping from an opening at its top portion. The L-shape air gap 166 has a horizontal portion with a width W and a vertical portion with a height H. In various embodiments, a ratio of W/H ranges from about 0.3 to about 2. If the ratio of W/H is less than about 0.3, the vertical portion may be too high for the etching by-products formed at the top of the air gap 166 to travel all the way down to the opening 132S at the bottom and in turn accumulate at the top of the air gap 166. If the ratio of W/H is larger than 2, the vertical portion may be too short to provide sufficient coverage for sidewalls of the gate structure 150 and thus leading to poor isolation. In some embodiments, the seal dielectric layer 170 may include silicon nitride, silicon oxynitride, silicon carbonitride. In some embodiments, the seal dielectric layer 170 may include an oxide, such as TEOS, BPSG, FSG, PSG, and BSG. The seal dielectric layer 170 may include different or same material as the ILD layer 138. In the present embodiment, the seal dielectric layer 170 is a silicon nitride layer. In embodiments, the seal dielectric layer 170 may have a thickness in a range of about 1 nm to about 5 nm, for example. In one example, the seal dielectric layer 170 has a thickness smaller than the CES layer 136. In another example, the seal dielectric layer 170 has a thickness larger than the CES layer 136.

At operation 58, the method 10 (FIG. 1C) forms source/drain contacts 172 in the source/drain contact holes 164, as shown in FIGS. 28A and 28B, which are cross-sectional views along A-A line and B-B line in the FIG. 9, respectively. In some embodiments, the method 10 at operation 58 first performs an anisotropic etching to remove horizontal portions of the seal dielectric layer 170 and expose the source/drain features 126. Subsequently, the method 10 at operation 58 deposits one or more metals into the source/drain contact holes 164, performing an annealing process to cause reaction between the one or more metals and the source/drain features 126 to produce a silicide feature (not shown). The one or more metals may include titanium (Ti), tantalum (Ta), tungsten (W), nickel (Ni), platinum (Pt), ytterbium (Yb), iridium (Jr), erbium (Er), cobalt (Co), or a combination thereof (e.g., an alloy of two or more metals) and may be deposited using CVD, PVD, ALD, or other suitable methods. The silicide feature may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), a combination thereof, or other suitable compounds. In an embodiment, the method 10 at operation 58 then deposits the source/drain contacts 172 over the silicide feature. The source/drain contacts 172 may include tungsten (W), cobalt (Co), molybdenum (Mo), ruthenium (Ru), copper (Cu), nickel (Ni), titanium (Ti), tantalum (Ta), titanium nitride (TiN), tantalum nitride (TaN), or other metals, and may be formed by CVD, PVD, ALD, plating, or other suitable processes.

Still referring to FIGS. 28A and 28B, the seal spacer 122, the L-shape air gap 166, the CES layer 136, and the seal dielectric layer 170 collectively form gate spacers containing air gaps, which are also termed as air-gap spacers. As used herein, the term "air gap" is used to describe a void defined by surrounding substantive features, where a void may contain air, nitrogen, ambient gases, gaseous chemicals used in previous or current processes, or combinations thereof. The air-gap spacers are interposed between the metal gate structure 150 and the source/drain contacts 172. The air gaps enclosed in the gate spacers results in a significant improvement in the overall k for the structure, e.g., an air gap from about 35% to about 40% in volume between the metal gate structure and source/drain contacts will reduce capacitance by approximately 15%, which in turn improves device high speed performance.

Figures 29A, 29B:
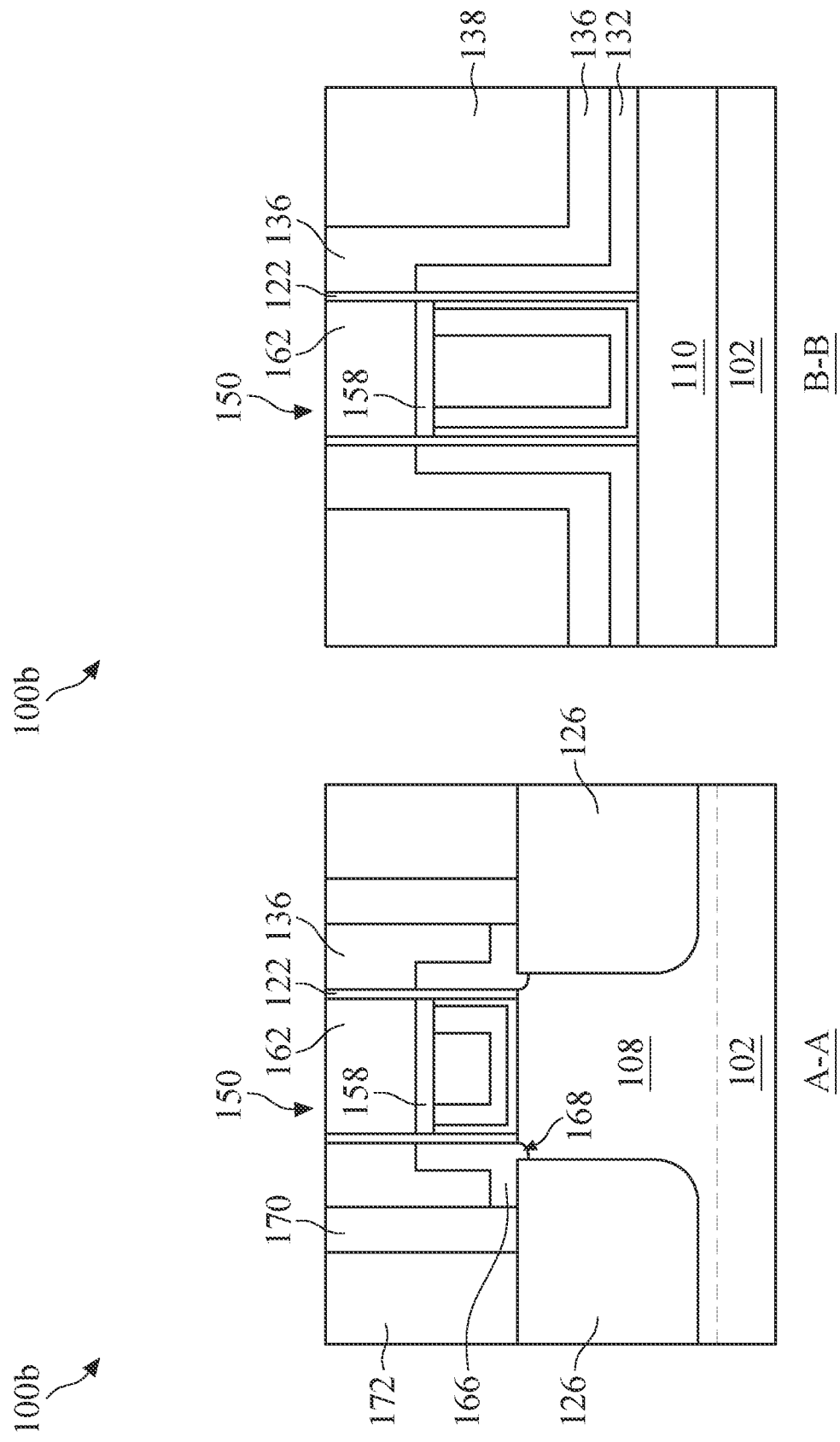

FIGS. 29A and 29B show an alternative embodiment of the resultant structure after operation 58, which are cross-sectional views along A-A line and B-B line in the FIG. 9, respectively. Some processes and materials used to form the semiconductor device 100b may be similar to, or the same as, those to form semiconductor structure 100a as described previously and are not repeated herein. One difference is that at operation 52, the source/drain contact holes 164 are limited in a region above the top surface of the source/drain features 126 (along A-A line) but not on sidewalls of the source/drain features 126 (along B-B line), such that the L-shape air gap 166 is directly above the source/drain features 126 and yet portions of the sacrificial spacer layer 132, the CES layer 136, and the ILD layer 138 direct above the isolation structure 110 remain substantially intact.

FIG. 30 shows another alternative embodiment of the resultant structure after operation 58, which is a cross-sectional view along A-A line in the FIG. 9. Some processes and materials used to form the semiconductor device 100c may be similar to, or the same as, those to form semiconductor structure 100a or 100b as described previously and are not repeated herein. One difference is that at operation 48, the gate structure 150 is recessed to a height H' substantially the same with the height H of the sacrificial spacer layer 132 (H'=H), such that after operation 58, the top surface of the recessed gate structure 150 is leveled (or coplanar) with the top surface of the L-shape air gap 166. Accordingly, the top surface of the gate SAC capping layer 158 is above the top surface of the L-shape air gap 166. In various embodiments, a ratio of H/H' ranges from about 0.7 to about 2. For a given recessed gate structure 150 height H', if the ratio of H/H' is smaller than 0.7, the L-shape air gap 166 may be not high enough to provide sufficient coverage for sidewalls of the gate structure 150 and thus leading to poor isolation; if the ratio of H/H' is larger than 2, the vertical portion of the L-shape air gap 166 may be too high for the etching by-products during air gap formation to travel from the top of the air gap 166 all the way down to the opening of the air gap at the bottom and in turn accumulate at the top of the air gap 166.

FIG. 31 shows yet another alternative embodiment of the resultant structure after operation 58, which is a cross-sectional view along A-A line in the FIG. 9. Some processes and materials used to form the semiconductor device 100d may be similar to, or the same as, those to form semiconductor structure 100 or 100b as described previously and are not repeated herein. One difference is that at operation 48, the gate structure 150 is recessed to a height H' lower than the height H of the sacrificial spacer layer 132 (H'<H), such that the top surface of the gate SAC capping layer 158 is also below the top surface of the L-shape air gap 166 after operation 58. The relatively larger air gap further reduces the stray capacitance between a gate structure and source/drain contacts.

At operation 60, the method 10 (FIG. 1C) performs further fabrication processes in order to complete the fabrication of the device. For example, the method 10 may form multi-layer interconnect structure that connects the gate structure 150 and the source/drain contacts 172 with other parts of the device to form a complete IC.

Figure 32:
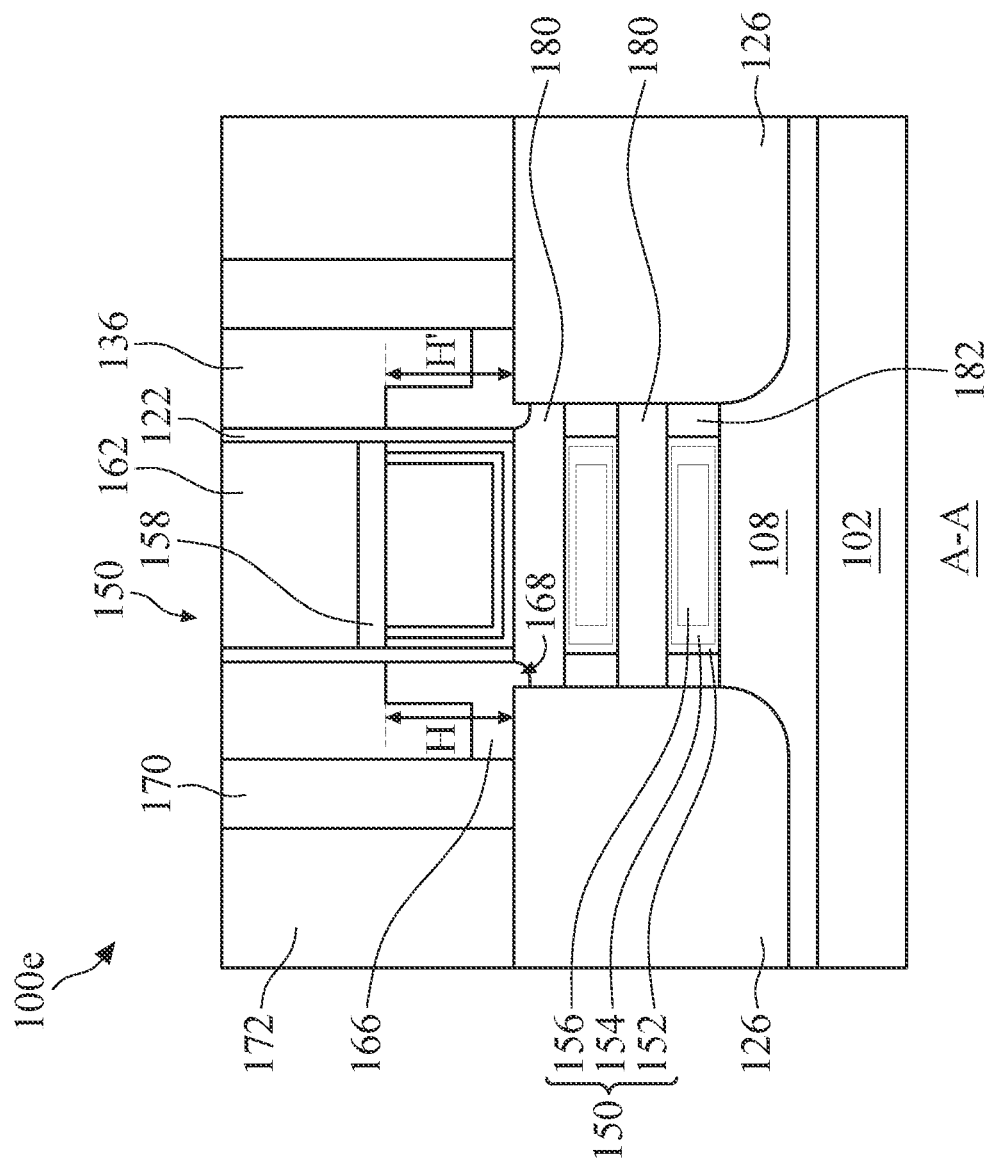

Although embodiments that include fin-like FETs (FinFETs) are illustrated in FIGS. 2-31, the present disclosure is not so limited and may be application to other types of field effect transistors, such as planar transistors or gate-all-around (GAA) transistors. For example, embodiments of the present disclosure provide a method of forming air-gap spacers interposing a gate stack and source/drain contacts of a GAA transistor 100e, as illustrated in FIG. 32. Some processes and materials used to form the illustrated alternative embodiment may be similar to or the same as what has been described previously in association with FIGS. 2-31, and are not repeated herein. Like reference numerals are used to denote like features. The GAA transistor 100e gets its name from the gate structure 150 which extends around the vertically stacked nanostructures 180 (also known as channel layers 180) providing access to the channel region on four sides. Inner spacer features 182 are interposing the gate structure 150 and the source/drain features 126 to provide isolation. GAA transistors are compatible with conventional complementary metal-oxide-semiconductor (CMOS) processes and their structure allows them to be aggressively scaled while maintaining gate control and mitigating short-channel effects (SCEs). The air-gap spacers interposing the gate structure 150 and the source/drain contacts 172 further reduce stray capacitance in the GAA transistor 100e.

Although not intended to be limiting, one or more embodiments of the present disclosure provide many benefits to a semiconductor device and the formation thereof, including fin-type field effect transistors (FinFETs) or gate-all-around (GAA) transistors. For example, the fins may be patterned to produce a relatively close spacing between features, for which the above disclosure is well suited. Gate spacers used in forming FinFETs or GAA transistors can be processed according to the above disclosure. For example, embodiments of the present disclosure provide a method of forming air-gap spacers interposing a gate stack and source/drain contacts. The relative permittivity (or dielectric constant) between the gate stack and source/drain contacts is lower, which reduces interference, noise, and parasitic coupling capacitance between interconnects. Further, the disclosed methods can be easily integrated into existing semiconductor manufacturing processes.

In one exemplary aspect, the present disclosure is directed to a method. The method includes forming a sacrificial gate stack on a substrate; depositing a sacrificial spacer layer, the sacrificial spacer layer having a vertical portion over sidewalls of the sacrificial gate stack and a horizontal portion over the substrate; depositing a first dielectric layer covering the horizontal portion and the vertical portion of the sacrificial spacer layer; patterning the first dielectric layer and the sacrificial spacer layer, thereby exposing a sidewall of the horizontal portion of the sacrificial spacer layer; removing the horizontal portion and the vertical portion of the sacrificial spacer layer by an etching process through the exposed sidewall, thereby forming an air gap under the first dielectric layer; and depositing a second dielectric layer over sidewalls of the first dielectric layer, thereby sealing the air gap. In some embodiments, the air gap has an L-shape. In some embodiments, the method further includes prior to the patterning of the first dielectric layer and the sacrificial spacer layer, replacing the sacrificial gate stack with a metal gate stack. In some embodiments, a top surface of the metal gate stack is below a top surface of the air gap. In some embodiments, a top surface of the metal gate stack is substantially leveled with a top surface of air gap. In some embodiments, the method further includes prior to the depositing of the sacrificial spacer layer, depositing a seal spacer over the sidewalls of the sacrificial gate stack, wherein a vertical portion of the air gap expands horizontally from the first dielectric layer to the seal spacer. In some embodiments, a horizontal portion of the air gap expands horizontally from the second dielectric layer to the seal spacer. In some embodiments, the method further includes prior to the depositing of the first dielectric layer, recessing the vertical portion of the sacrificial spacer layer to a position below the sacrificial gate stack. In some embodiments, the method further includes forming a source/drain feature over the substrate, wherein a top surface of the source/drain feature is exposed in the air gap. In some embodiments, the method further includes forming a source/drain contact over the source/drain feature, wherein the first and second dielectric layers are interposing the air gap and the source/drain contact.

In another exemplary aspect, the present disclosure is directed to a method of forming a semiconductor device. The method includes forming a fin protruding from a substrate; forming a gate stack over the fin; forming a seal spacer on a sidewall of the gate stack; depositing a sacrificial spacer layer on a sidewall of the seal spacer and on a top surface of the fin; depositing a first dielectric layer over the sacrificial spacer layer; depositing a second dielectric layer over the first dielectric layer; etching the second dielectric layer, the first dielectric layer, and the sacrificial spacer layer, thereby forming a trench exposing a bottom portion of the sacrificial spacer layer; removing the sacrificial spacer layer by applying an etchant in the trench, thereby forming an air gap with an opening at a bottom portion of the trench; and depositing a third dielectric layer in the trench, thereby sealing the opening of the air gap. In some embodiments, the air gap exposes the top surface of the fin. In some embodiments, the etching of the sacrificial spacer layer forms a dip in the top surface of the fin. In some embodiments, the method further includes forming a source/drain feature over the fin, wherein the trench exposes the source/drain feature, and wherein the air gap exposes a top surface of the source/drain feature. In some embodiments, the gate stack is a dummy gate stack, and the method further includes removing the dummy gate stack, thereby forming a gate trench; forming a metal gate stack in the gate trench, wherein a top surface of the metal gate stack is below a top surface of the air gap; and forming a gate capping layer over the top surface of the metal gate stack. In some embodiments, a top surface of the gate capping layer is below the top surface of the air gap.

In another exemplary aspect, the present disclosure is directed to a semiconductor device. The semiconductor device a substrate having source/drain features with a channel region interposing therebetween; a gate stack over the channel region; source/drain contacts over the source/drain features; and a gate spacer interposing the gate stack and the source/drain contacts. The gate spacer includes a first spacer layer over sidewalls of the gate stack, a second spacer layer over sidewalls of the source/drain contacts, an air gap interposing the first and second spacer layers, wherein a top surface of the source/drain features is exposed in the air gap, and a third spacer layer capping a top surface of the air gap. In some embodiments, the air gap has a horizontal portion and a vertical portion forming an L-shape. In some embodiments, a top surface of the air gap is above the gate stack. In some embodiments, the semiconductor device further includes a gate capping layer over the gate stack and a top surface of the air gap is above the gate capping layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a sacrificial gate stack on a substrate;
    depositing a sacrificial spacer layer, the sacrificial spacer layer having a vertical portion over sidewalls of the sacrificial gate stack and a horizontal portion over the substrate;
    depositing a first dielectric layer covering the horizontal portion and the vertical portion of the sacrificial spacer layer;
    patterning the first dielectric layer and the sacrificial spacer layer, thereby exposing a sidewall of the horizontal portion of the sacrificial spacer layer;
    removing the horizontal portion and the vertical portion of the sacrificial spacer layer by an etching process through the exposed sidewall, thereby forming an air gap under the first dielectric layer; and
    depositing a second dielectric layer along sidewalls of the first dielectric layer, thereby sealing the air gap.

2. The method of claim 1, wherein the air gap has an L-shape.

3. The method of claim 1, further comprising:
    prior to the patterning of the first dielectric layer and the sacrificial spacer layer, replacing the sacrificial gate stack with a metal gate stack.

4. The method of claim 3, wherein a top surface of the metal gate stack is below a top surface of the air gap.

5. The method of claim 3, wherein a top surface of the metal gate stack is substantially leveled with a top surface of air gap.

6. The method of claim 1, further comprising:
    prior to the depositing of the sacrificial spacer layer, depositing a seal spacer along the sidewalls of the sacrificial gate stack, wherein after the air gap is formed a vertical portion of the air gap expands horizontally from the first dielectric layer to the seal spacer.

7. The method of claim 6, wherein after the air gap is formed a horizontal portion of the air gap expands horizontally from the second dielectric layer to the seal spacer.

8. The method of claim 1, further comprising:
    prior to the depositing of the first dielectric layer, recessing the vertical portion of the sacrificial spacer layer to a position below a top surface the sacrificial gate stack.

9. The method of claim 1, further comprising:
    forming a source/drain feature over the substrate, wherein a top surface of the source/drain feature is exposed in the air gap.

10. The method of claim 9, further comprising:
    forming a source/drain contact over the source/drain feature, wherein the first and second dielectric layers are interposing the air gap and the source/drain contact.

11. A method of forming a semiconductor device, comprising:
    forming a fin protruding from a substrate;
    forming a gate stack over the fin;
    forming a seal spacer on a sidewall of the gate stack;
    depositing a sacrificial spacer layer on a sidewall of the seal spacer and on a top surface of the fin;
    depositing a first dielectric layer over the sacrificial spacer layer;
    depositing a second dielectric layer over the first dielectric layer;
    etching the second dielectric layer, the first dielectric layer, and the sacrificial spacer layer, thereby forming a trench exposing a bottom portion of the sacrificial spacer layer;
    removing the sacrificial spacer layer by applying an etchant in the trench, thereby forming an air gap with an opening at a bottom portion of the trench; and
    depositing a third dielectric layer in the trench, thereby sealing the opening of the air gap.

12. The method of claim 11, wherein the air gap exposes the top surface of the fin.

13. The method of claim 12, wherein the etching of the sacrificial spacer layer forms a dip in the top surface of the fin.

14. The method of claim 11, further comprising:
forming a source/drain feature over the fin, wherein the trench exposes the source/drain feature, and wherein the air gap exposes a top surface of the source/drain feature.

15. The method of claim 11, wherein the gate stack is a dummy gate stack, further comprising:
removing the dummy gate stack, thereby forming a gate trench;
forming a metal gate stack in the gate trench, wherein a top surface of the metal gate stack is below a top surface of the air gap; and
forming a gate capping layer over the top surface of the metal gate stack.

16. The method of claim 15, wherein a top surface of the gate capping layer is below the top surface of the air gap.

17. A method of forming a semiconductor device, comprising:
forming a fin protruding from a substrate;
forming a sacrificial gate stack across the fin;
forming a gate spacer layer on sidewalls of the sacrificial gate stack;
growing an epitaxial feature adjacent the gate spacer layer;
after the growing of the epitaxial feature, thinning the gate spacer layer;
depositing a sacrificial layer on sidewalls of the gate spacer layer and on a top surface of the epitaxial feature;
depositing a first dielectric layer over the sacrificial spacer layer;
replacing the sacrificial gate stack with a metal gate stack;
etching the first dielectric layer and the sacrificial layer to expose a sidewall of the sacrificial layer;
removing the sacrificial layer to form an air gap under the first dielectric layer; and
depositing a second dielectric layer on sidewalls of the first dielectric layer, wherein the second dielectric layer seals the air gap.

18. The method of claim 17, wherein the etching of the first dielectric layer and the sacrificial layer is after the replacing of the sacrificial gate stack.

19. The method of claim 17, further comprising:
prior to the depositing of the first dielectric layer, partially removing a vertical portion of the sacrificial layer from the sidewalls of the gate spacer layer.

20. The method of claim 17, wherein the top surface of the epitaxial feature is exposed in the air gap.

* * * * *